(12) United States Patent
Baek et al.

(10) Patent No.: US 10,950,624 B2
(45) Date of Patent: Mar. 16, 2021

(54) VERTICAL MEMORY DEVICES

(71) Applicant: Samsung Electronics Co., Ltd., Suwon-si (KR)

(72) Inventors: Seok-Cheon Baek, Hwaseong-si (KR); Ji-Ye Noh, Incheon (KR); Yoon-Hwan Son, Seoul (KR); Ji-Sung Cheon, Ansan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 13 days.

(21) Appl. No.: 16/419,204

(22) Filed: May 22, 2019

(65) Prior Publication Data

US 2020/0185409 A1 Jun. 11, 2020

(30) Foreign Application Priority Data

Dec. 10, 2018 (KR) ........................ 10-2018-0157921

(51) Int. Cl.
*H01L 27/11582* (2017.01)
*H01L 27/11565* (2017.01)
*H01L 29/423* (2006.01)
*H01L 29/10* (2006.01)

(52) U.S. Cl.
CPC .. *H01L 27/11582* (2013.01); *H01L 27/11565* (2013.01); *H01L 29/1037* (2013.01); *H01L 29/4234* (2013.01)

(58) Field of Classification Search
CPC ......... H01L 27/11582; H01L 27/11565; H01L 29/4234; H01L 29/1037
See application file for complete search history.

(56) References Cited

U.S. PATENT DOCUMENTS

| | | | |
|---|---|---|---|
| 9,520,406 B2 | 12/2016 | Makala et al. | |
| 9,570,463 B1 | 2/2017 | Zhang et al. | |
| 9,853,043 B2 | 12/2017 | Lu et al. | |
| 9,911,751 B2 | 3/2018 | Kwon et al. | |
| 9,991,280 B2 | 6/2018 | Nakamura et al. | |
| 10,553,609 B2* | 2/2020 | Lee .................. | H01L 27/11565 |
| 10,622,369 B2* | 4/2020 | Zhou ................. | H01L 27/11548 |
| 2013/0277731 A1 | 10/2013 | Goda et al. | |
| 2016/0005760 A1* | 1/2016 | Lee .................... | H01L 27/1157 |
| | | | 257/324 |
| 2016/0126252 A1* | 5/2016 | Tsuda ............... | H01L 21/02164 |
| | | | 257/314 |
| 2017/0110473 A1* | 4/2017 | Lee .................. | H01L 27/11582 |
| 2017/0352552 A1* | 12/2017 | Lee .................... | H01L 21/3065 |

(Continued)

FOREIGN PATENT DOCUMENTS

KR 10-2019-0014260 2/2019

*Primary Examiner* — Nathan W Ha
(74) *Attorney, Agent, or Firm* — Muir Patent Law, PLLC

(57) ABSTRACT

A vertical memory device includes gate electrodes on a substrate and a channel. The gate electrodes are spaced apart from each other in a vertical direction substantially perpendicular to an upper surface of the substrate. The channel extends through the gate electrodes, and includes a first portion, a second portion and a third portion. The second portion is formed on and connected to the first portion, and has a sidewall slanted with respect to the upper surface of the substrate so as to have a width gradually decreasing from a bottom toward a top thereof. The third portion is formed on and connected to the second portion.

19 Claims, 27 Drawing Sheets

(56) References Cited

U.S. PATENT DOCUMENTS

2017/0358356 A1* 12/2017 Lee .................. H01L 29/517
2017/0358362 A1* 12/2017 Lee .................. G11C 16/0483
2018/0076214 A1* 3/2018 Lim .................. H01L 29/1037
2019/0035942 A1 1/2019 Kwon et al.

* cited by examiner

A
1ST DIRECTION

2ND DIRECTION

3RD DIRECTION

A'

VERTICAL MEMORY DEVICES

CROSS-REFERENCE TO RELATED APPLICATIONS

This application claims priority under 35 U.S.C. § 119 to Korean Patent Application No. 10-2018-0157921, filed on Dec. 10, 2018, in the Korean Intellectual Property Office (KIPO), the contents of which are herein incorporated by reference in their entirety.

BACKGROUND

1. Field

The inventive concepts relate to a vertical memory device.

2. Description of the Related Art

In a VNAND flash memory device, as the number of gate electrodes stacked in a vertical direction increases, channel holes extending through a mold may not be formed by one process, and each of the mold and the channel holes may be formed by two processes. However, when multiple processes are performed, a sacrificial layer filling lower channel holes may not be completely removed so that residue may remain in the lower channel holes, or the sacrificial layer may have a large thickness so that a substrate on which the VNAND flash memory device may be formed may warp.

SUMMARY

Example embodiments provide a vertical memory device having improved characteristics.

According to example embodiments, the disclosure is directed to a vertical memory device comprising: gate electrodes stacked on a substrate, the gate electrodes being spaced apart from each other in a vertical direction substantially perpendicular to an upper surface of the substrate; and a channel extending through the gate electrodes, the channel including: a first portion; a second portion on and connected to the first portion, the second portion having a sidewall slanted with respect to the upper surface of the substrate so that the second portion has a width that gradually decreases from a bottom toward a top of the second portion; and a third portion on and connected to the second portion.

According to example embodiments, the disclosure is directed to a vertical memory device comprising: gate electrodes stacked on a substrate, the gate electrodes being spaced apart from each other in a vertical direction substantially perpendicular to an upper surface of the substrate; and a channel extending through the gate electrodes, the channel including: a first portion having a width that gradually increases from a bottom toward a top of the first portion; a second portion on and connected to the first portion, the second portion having a width that gradually decreases from a bottom toward a top of the second portion; and a third portion on and connected to the second portion, the third portion having a width that gradually increases from a bottom toward a top of the third portion.

According to example embodiments, the disclosure is directed to a vertical memory device comprising: gate electrodes stacked on a substrate, the gate electrodes being spaced apart from each other in a vertical direction substantially perpendicular to an upper surface of the substrate; and a channel extending through the gate electrodes, the channel including: a first portion having a width that gradually increases from a bottom toward a top of the first portion; a protrusion protruding upwardly from an upper surface of the first portion; and a second portion on and connected to the first portion, the second portion having a width that gradually increases from a bottom toward a top of the second portion, wherein a width of a lower portion of the second portion is less than a width of an upper portion of the first portion.

BRIEF DESCRIPTION OF THE DRAWINGS

FIG. 24 is a cross-sectional view illustrating a vertical memory device in accordance with example embodiments.

DETAILED DESCRIPTION

The above and other aspects and features of the vertical memory devices and the methods of manufacturing the same in accordance with example embodiments will become readily understood from detail descriptions that follow, with reference to the accompanying drawings.

Figure 1:
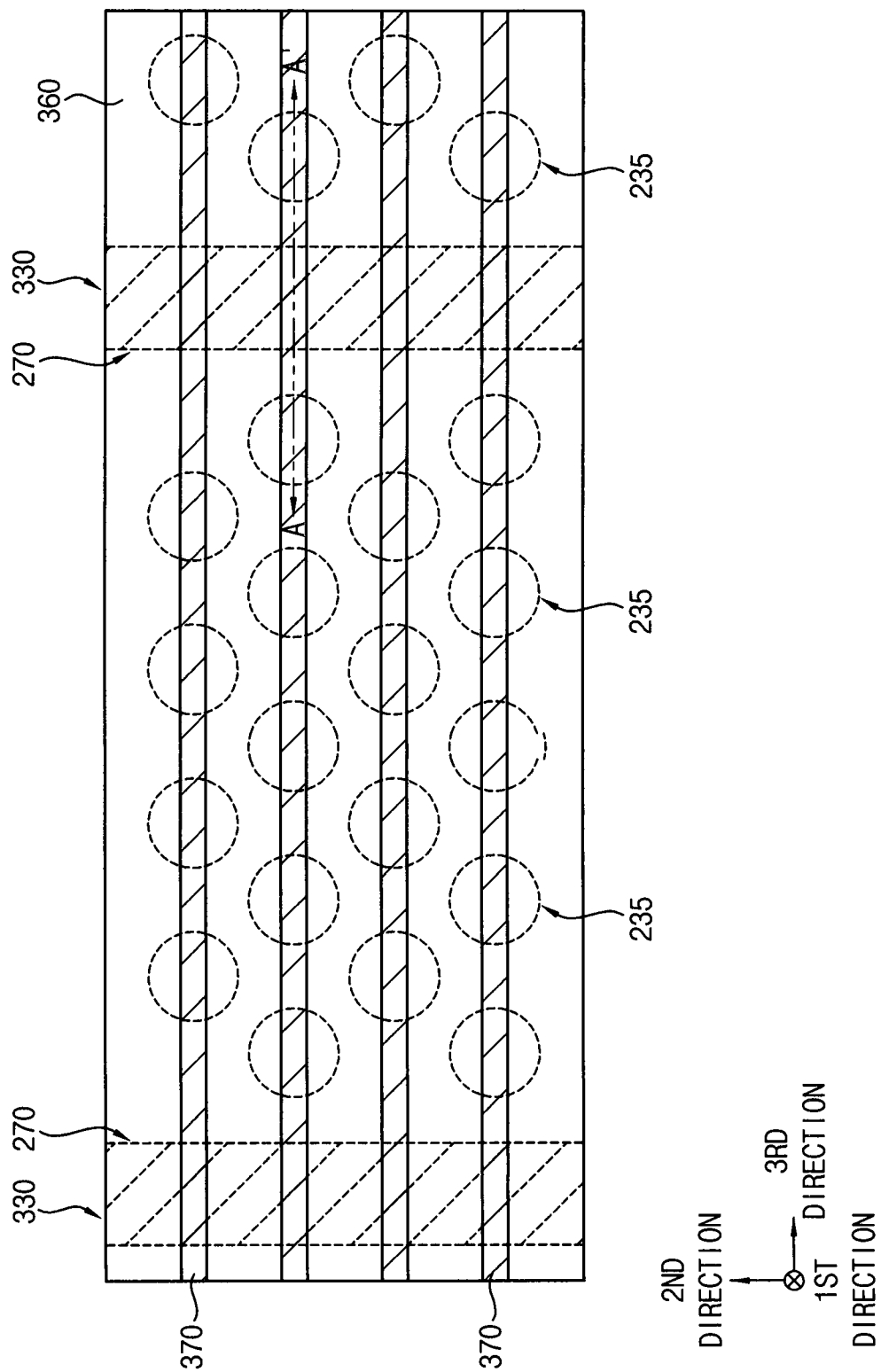
FIGS. 1, 2A and 2B are a plan view and cross-sectional views illustrating a vertical memory device in accordance with example embodiments.
Figure 2A:
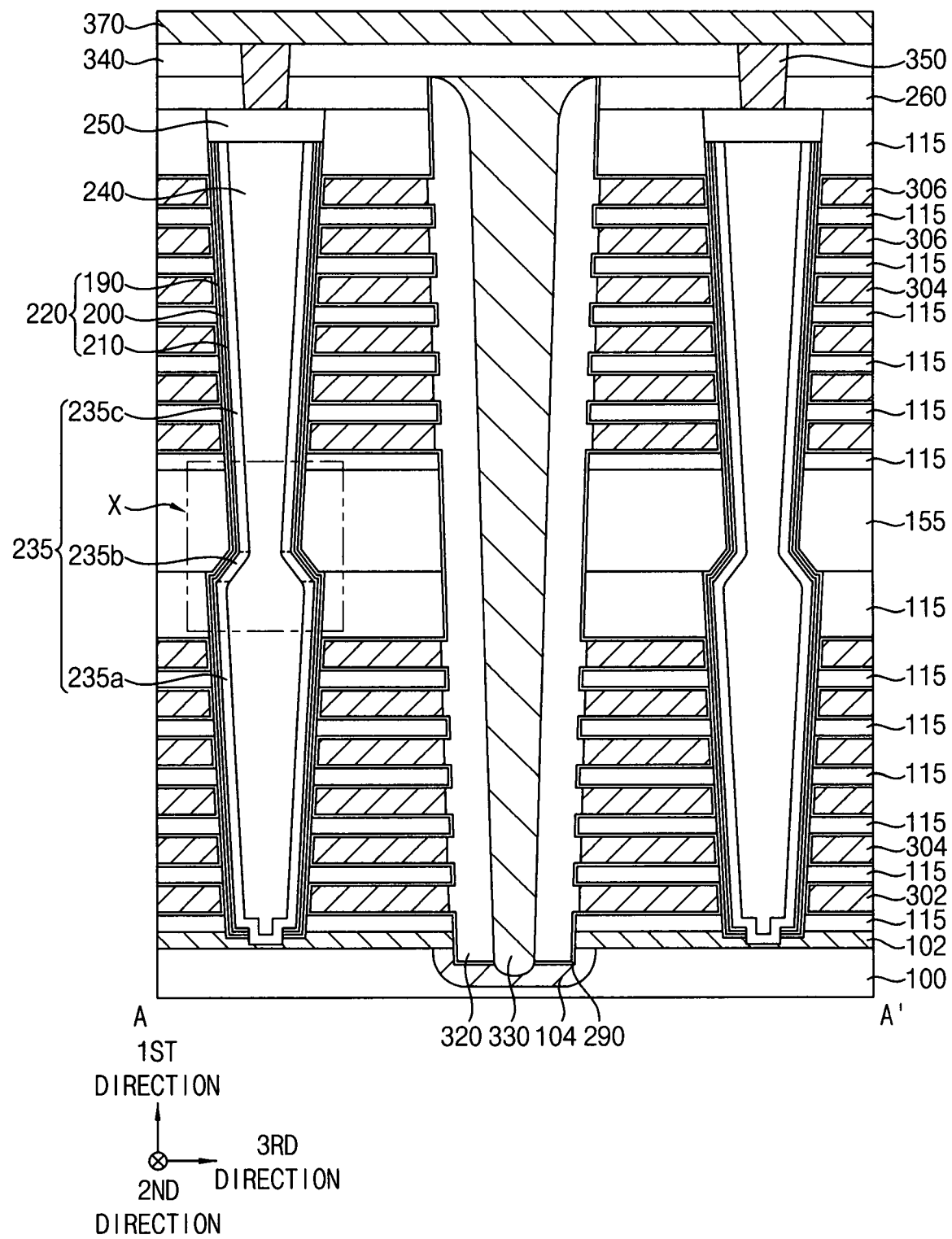
Figure 2B:
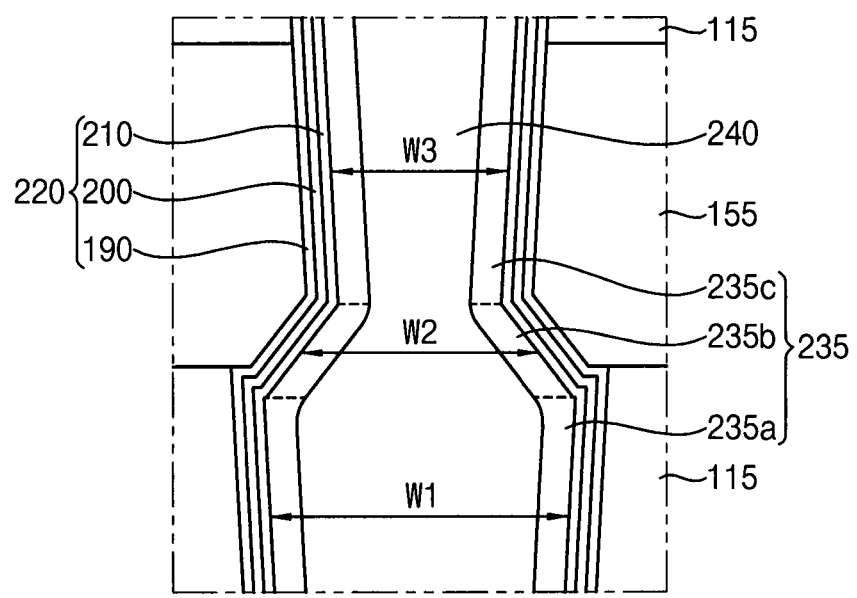

FIGS. 1, 2A, and 2B are a plan view and cross-sectional views illustrating a vertical memory device in accordance with example embodiments. Particularly, FIG. 1 is the plan view, FIG. 2A is a cross-sectional view taken along a line A-A' of FIG. 1, and FIG. 2B is an enlarged cross-sectional view of a region X of FIG. 2A.

Hereinafter, a direction substantially perpendicular to an upper surface of a substrate may be defined as a first direction, and two directions substantially parallel to the upper surface of the substrate and crossing each other may be defined as second and third directions, respectively. In example embodiments, the second and third directions may be substantially perpendicular to each other.

Referring to FIGS. 1, 2A, and 2B, the vertical memory device may include a gate electrode structure, an insulation pattern structure, a connecting pattern 155, and a second structure extending therethrough on a substrate 100. The vertical memory device may further include first and second impurity regions 102 and 104, a second blocking layer 290, a second spacer 320, a common source line (CSL) 330, a contact plug 350, a bit line 370, and first to third insulating interlayers 260, 340 and 360.

The substrate 100 may include silicon, germanium, silicon-germanium or a III-V compound such as GaP, GaAs, GaSb, etc. In some embodiments, the substrate 100 may be a silicon-on-insulator (SOI) substrate or a germanium-on-insulator (GOI) substrate.

The first impurity region 102 may be formed at an upper portion of the substrate 100. The first impurity region 102 may include carbon, or n-type or p-type impurities.

The gate electrode structure may include a plurality of gate electrodes at a plurality of levels, respectively, spaced apart from each other in the first direction. Additionally, the gate electrode structure may extend in the second direction, and a plurality of gate electrode structures may be formed in the third direction. For example, the gate electrode structures each of which may extend in the second direction at the same level may be divided in the third direction by an opening 270 extending lengthwise in the second direction. An item, layer, or portion of an item or layer described as extending "lengthwise" in a particular direction has a length in the particular direction and a width perpendicular to that direction, where the length is greater than the width.

In example embodiments, the CSL 330 extending lengthwise in the second direction may be formed in the opening 270, and the second spacer 320 may be formed on each of opposite sidewalls of the CSL 330 in the third direction. The second impurity region 104 may be formed at an upper portion of the substrate 100 adjacent to a lower surface of the CSL 330.

The CSL 330 may include a metal, a metal nitride and/or a metal silicide, the second spacer 320 may include an oxide, e.g., silicon oxide, and the second impurity region 104 may include n-type impurities, e.g., phosphorous, arsenic, etc.

Each of the gate electrode structures may include at least one first gate electrode 302, a plurality of second gate electrodes 304, and at least one third gate electrode 306 sequentially stacked in the first direction. The plurality of second gate electrodes 304 may be formed above the at least one first gate electrode 302 and below the at least one third gate electrode 306.

In example embodiments, the first gate electrode 302 may serve as a ground selection line (GSL), each of the second gate electrodes 304 may serve as a word line, and the third gate electrode 306 may serve as a string selection line (SSL).

FIG. 2A shows that the first gate electrode 302 is formed at one level, the second gate electrodes 304 are formed at nine levels, respectively, and the third gate electrode 306 is formed at two levels, respectively, however, the inventive concepts may not be limited thereto. For example, each of the first and third gate electrodes 302 and 306 may be formed at one or a plurality of levels, and the second gate electrode 304 may be formed at a plurality of levels. Particularly, the second gate electrodes 304 may be formed at a plurality of levels much more than nine levels, and some of the second gate electrodes 304 adjacent to the first gate electrode 302 and/or the third gate electrode 306 may serve as a dummy word line.

Each of the first to third gate electrodes 302, 304, and 306 may include a gate conductive pattern extending in the second direction and a gate barrier pattern covering upper and lower surfaces and a portion of a sidewall of the gate conductive pattern.

The gate conductive pattern may include a low resistance metal, e.g., tungsten, titanium, tantalum, platinum, etc., and the gate barrier pattern may include a metal nitride, e.g., titanium nitride, tantalum nitride, etc.

The insulation pattern structure may include a plurality of insulation patterns 115 stacked in the first direction at a plurality of levels, respectively. Individual ones of the insulation patterns 115 may be formed between an upper surface of the first impurity region 102 at the upper portion of the substrate 100 and the first gate electrode 302, between neighboring ones of the first to third gate electrodes 302, 304 and 306 in the first direction, and on the third gate electrode 306.

In example embodiments, each of the insulation patterns 115 at the respective plurality of levels may extend in the second direction, and a plurality of insulation patterns 115 may be spaced apart from each other by the opening 270 in the third direction. The insulation patterns 115 may include an oxide, e.g., silicon oxide.

In example embodiments, the connecting pattern 155 may be formed between two insulation patterns 115 in the middle levels, respectively. For example, a lower surface of the connecting pattern 155 may contact an upper surface of a lower one of the two insulation patterns 115, and an upper surface of the connecting pattern 155 may contact a lower surface of an upper one of the two insulation patterns 115. In some embodiments, a thickness of the lower one of the two insulation patterns 115 may be greater than a thickness of the upper one of the two insulation patterns 115. The connecting pattern 155 may include a material having a low gap-filling characteristic or a low step coverage characteristic, e.g., tetra ethyl ortho silicate (TEOS), high density plasma (HDP) oxide, etc.

The second structure may include a first structure and a pad 250 sequentially stacked on the first impurity region 102 of the substrate 100, and may extend in the first direction through the gate electrode structure, the connecting pattern 155, and the insulation pattern structure.

The first structure may include a channel 235 extending in the first direction from the upper surface of the first impurity region 102, a charge storage structure 220 covering an outer sidewall of the channel 235, and a filling pattern 240 filling an inner space defined by the channel 235.

In example embodiments, the channel 235 may have a hollow cylindrical shape or a cup-like shape, the filling pattern 240 may fill the inner space formed by the channel 235. For example, lower surfaces and a sidewall of the filling pattern 240 may be covered by the channel 235.

The channel 235 may include, e.g., crystalline silicon, and the filling pattern 240 may include an oxide, e.g., silicon oxide.

In example embodiments, a plurality of channels 235 may be formed in each of the second and third directions to define a channel array.

In example embodiments, the charge storage structure 220 covering the outer sidewall of the channel 235 may have a cup-like shape of which a central bottom is opened. The charge storage structure 220 may include a tunnel insulation pattern 210, a charge storage pattern 200 and a first blocking pattern 190 sequentially stacked in a horizontal direction from the outer sidewall of the channel 235. For example, the tunnel insulation pattern 210 may be formed on an outer sidewall of the channel 235, the charge storage pattern 200 may be formed on an outer sidewall of the tunnel insulation pattern 210, and the first blocking pattern 190 may be formed on an outer sidewall of charge storage pattern 200.

As used herein, the term "bottom," when used in conjunction with structures, patterns, and/or layers, may refer to that portion of the structures, patterns, and/or layers that is nearest to the substrate 100, and the term "top" may refer to that portion of the structures, patterns, and/or layers that is furthest away from the substrate 100.

The tunnel insulation pattern 210 and the first blocking pattern 190 may include an oxide, e.g., silicon oxide, and the charge storage pattern 200 may include a nitride, e.g., silicon nitride.

The first structure may have a pillar shape extending in the first direction from the upper surface of the first impurity region 102 at the upper portion of the substrate 100, and the second structure including the first structure and the pad 250 may also have a pillar shape. For example, when viewed top down, each of the first structure and the second structure will have a round shape. The pad 250 may include crystalline silicon doped with impurities.

In example embodiments, the channel 235 in the second structure may include first, second and third portions 235a, 235b and 235c contacting each other, each of which may have a sidewall slanted with respect to the upper surface of the substrate 100. The first, second, and third portions 235a, 235b, and 235c may be in material continuity with one another. As used herein, the terms "material continuity" and "materially in continuity" may refer to structures, patterns, and/or layers that are formed at the same time and of the same material, without a break in the continuity of the material of which they are formed. As one example, structures, patterns, and/or layers that are in "material continuity" or "materially in continuity" may be homogeneous monolithic structures.

In example embodiments, the first portion 235a of the channel 235 may have a first width W1 gradually increasing in the first direction upwardly, the second portion 235b of the channel 235 may have a second width W2 gradually decreasing in the first direction upwardly, and the third portion 235c of the channel 235 may have a third width W3 gradually increasing in the first direction upwardly. When viewed in cross-section, each of the first width W1, the second width W2, and the third width W3 may be the distance between external sidewalls of the first portion 235a, the second portion 235b, and the third portion 235c, respectively. For example, the first width W1, the second width W2, and the third width W3 may correspond to a diameter of the respective first portion 235a, the second portion 235b, and the third portion 235c. In some embodiments, the maximum of the first width W1 may be equal to the minimum of the second width W2, and the minimum of the third width W3 may be equal to the maximum of the second width W2.

In example embodiments, the sidewall of each of the first to third portions 235a, 235b and 235c of the channel 235 may have a constant slope with respect to the upper surface of the substrate 100.

In example embodiments, an upper portion of the first portion 235a of the channel 235 may be covered by the insulation pattern 115, and the second portion 235b of the channel 235 and a lower portion of the third portion 235c of the channel 235 may be covered by the connecting pattern 155.

The contact plug 350 may be formed on an upper surface of the pad 250, and the bit line 370 may be formed on an upper surface of the contact plug 350. The contact plug 350 may extend through the first and second insulating interlayers 260 and 340 to contact the upper surface of the pad 250, and the bit line 370 may extend through the third insulating interlayer 360 to contact the upper surface of the contact plug 350.

The contact plug 350 and the bit line 370 may include a metal, e.g., copper, aluminum, tungsten, titanium, tantalum, etc., and/or a metal nitride, e.g., titanium nitride, tantalum nitride, tungsten nitride, etc., and the first to third insulating interlayers 260, 340 and 360 may include an oxide, e.g., silicon oxide.

The second blocking layer 290 may be formed on upper and lower surfaces and a portion of a sidewall of each of the gate electrodes 302, 304 and 306, and a sidewall of each of the insulation patterns 115. The second blocking layer 290 may contact a sidewall of the charge storage structure 220.

Figure 3:
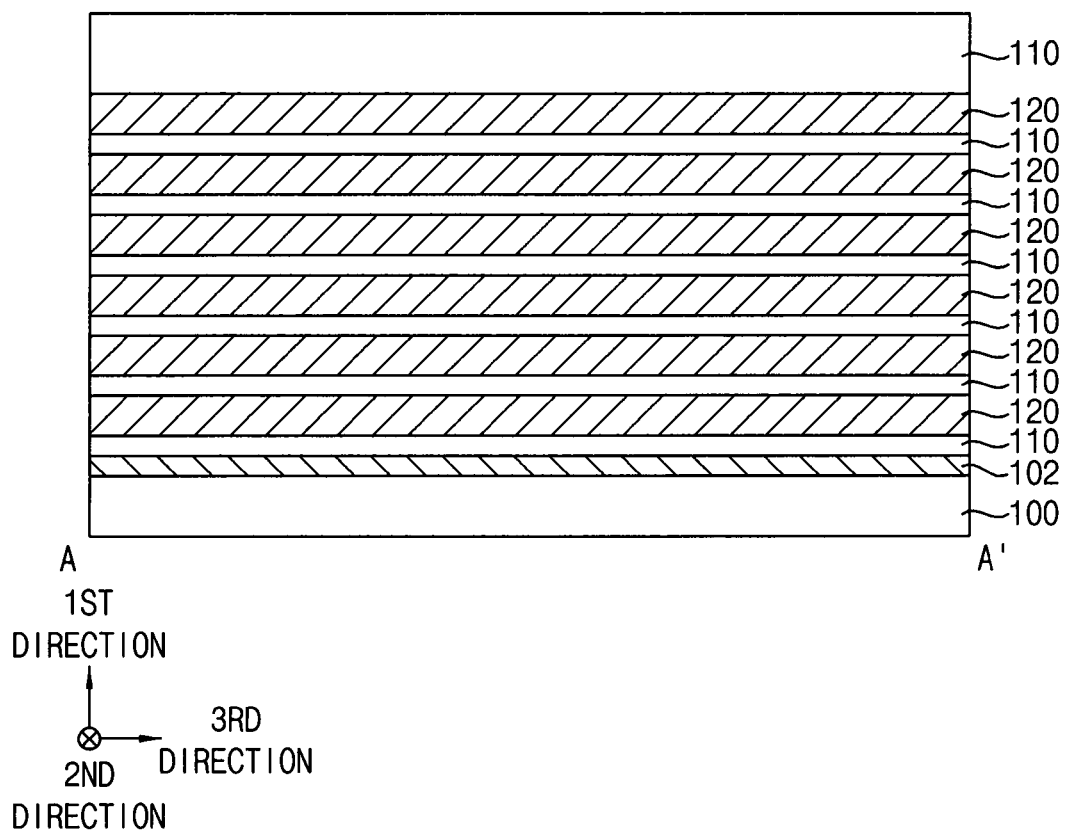
FIGS. 3 to 14 are plan views and cross-sectional views illustrating a method of manufacturing a vertical memory device in accordance with example embodiments.
Figure 4:
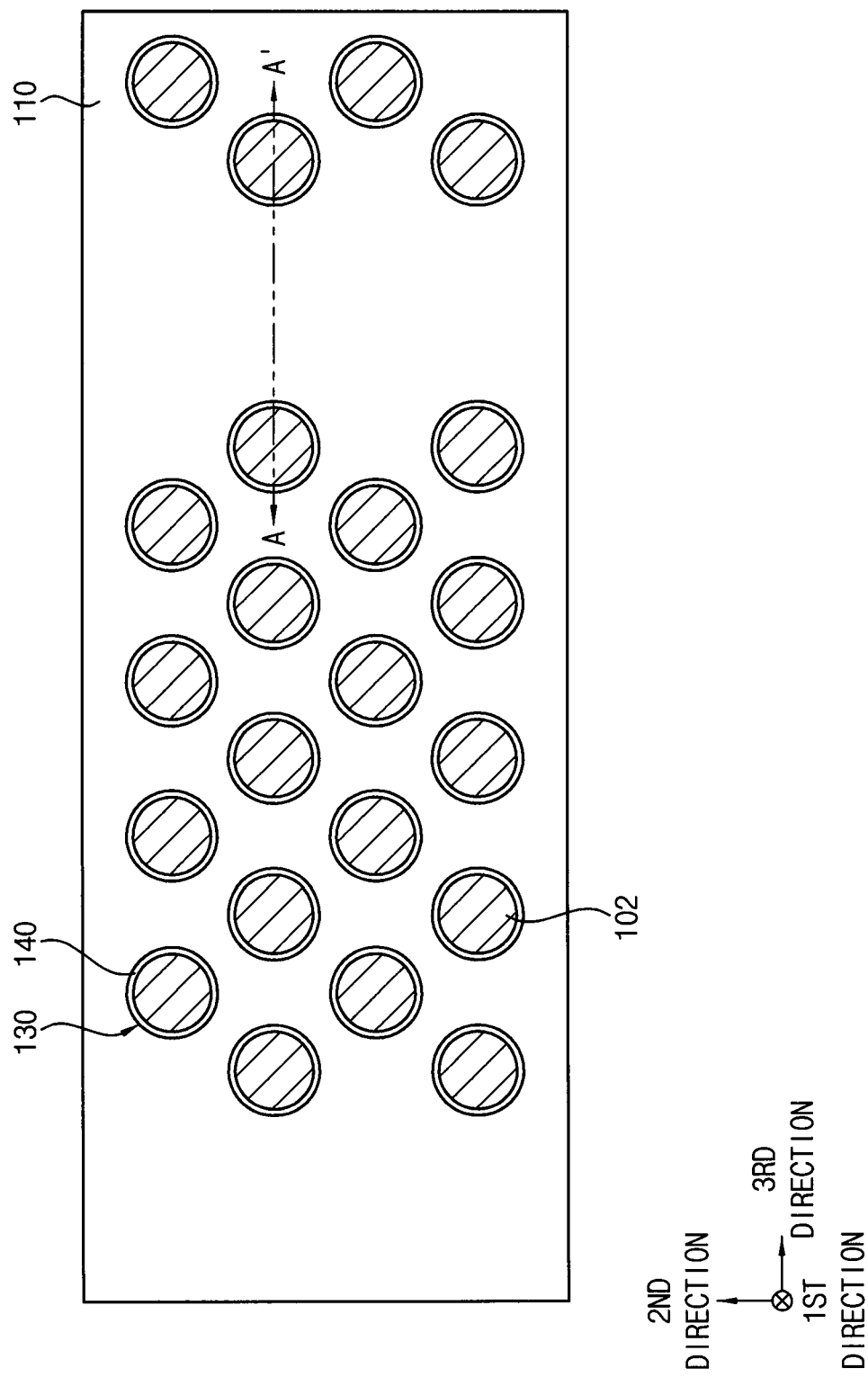
Figure 5:
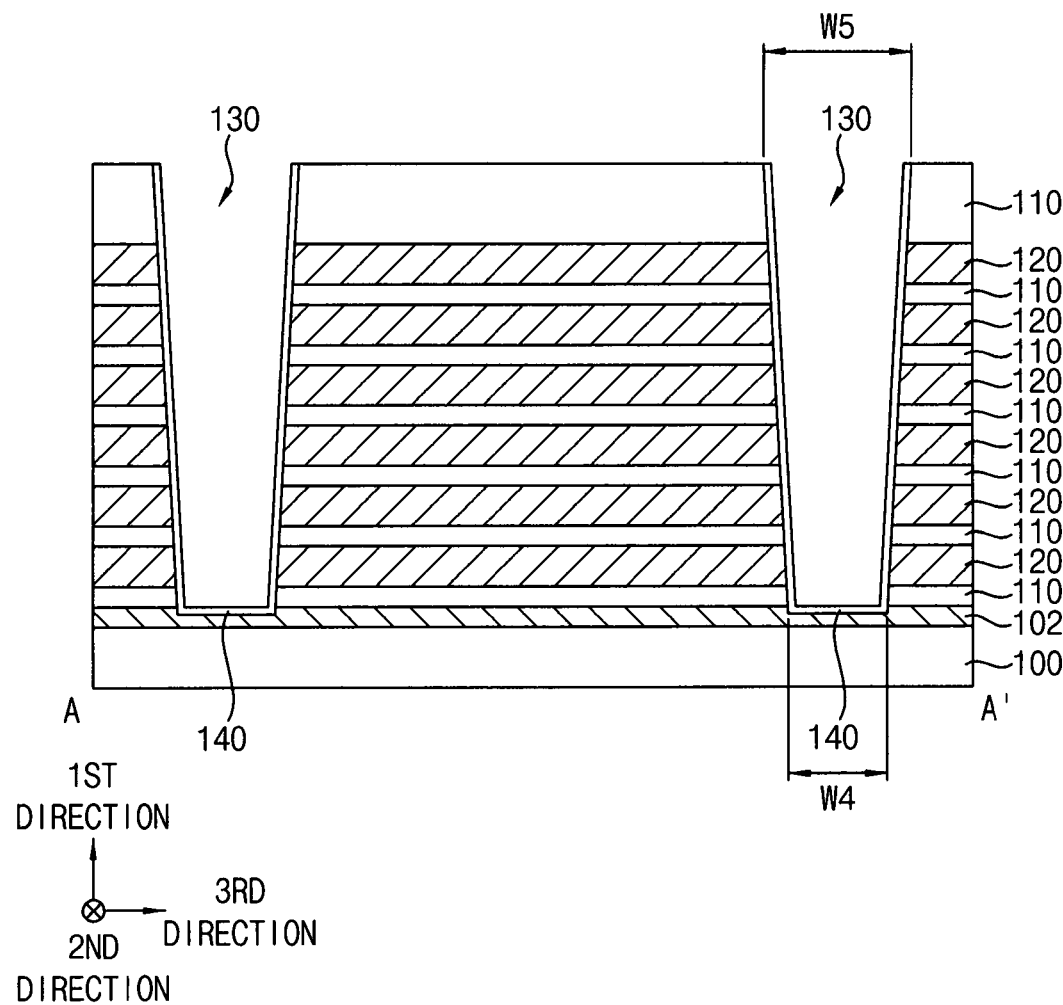
Figure 6:
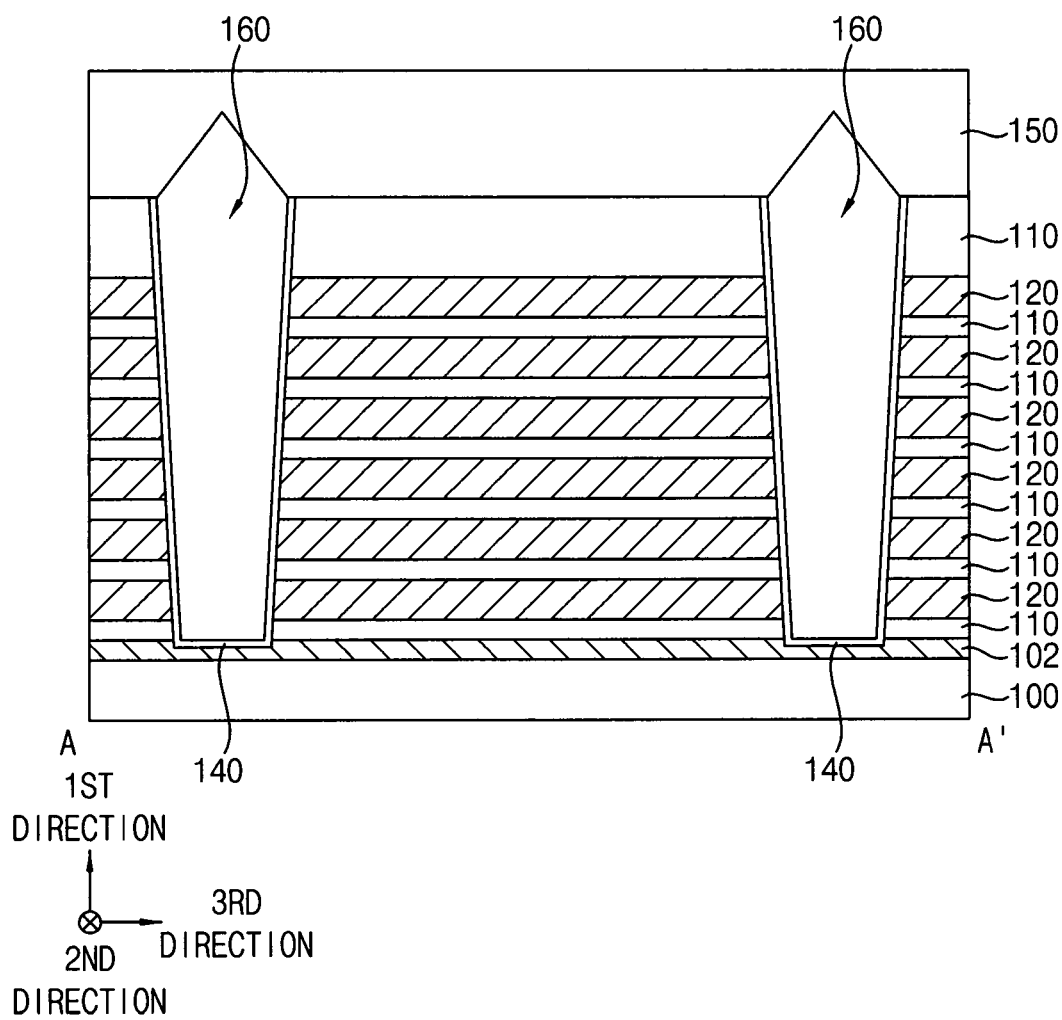
Figure 7:
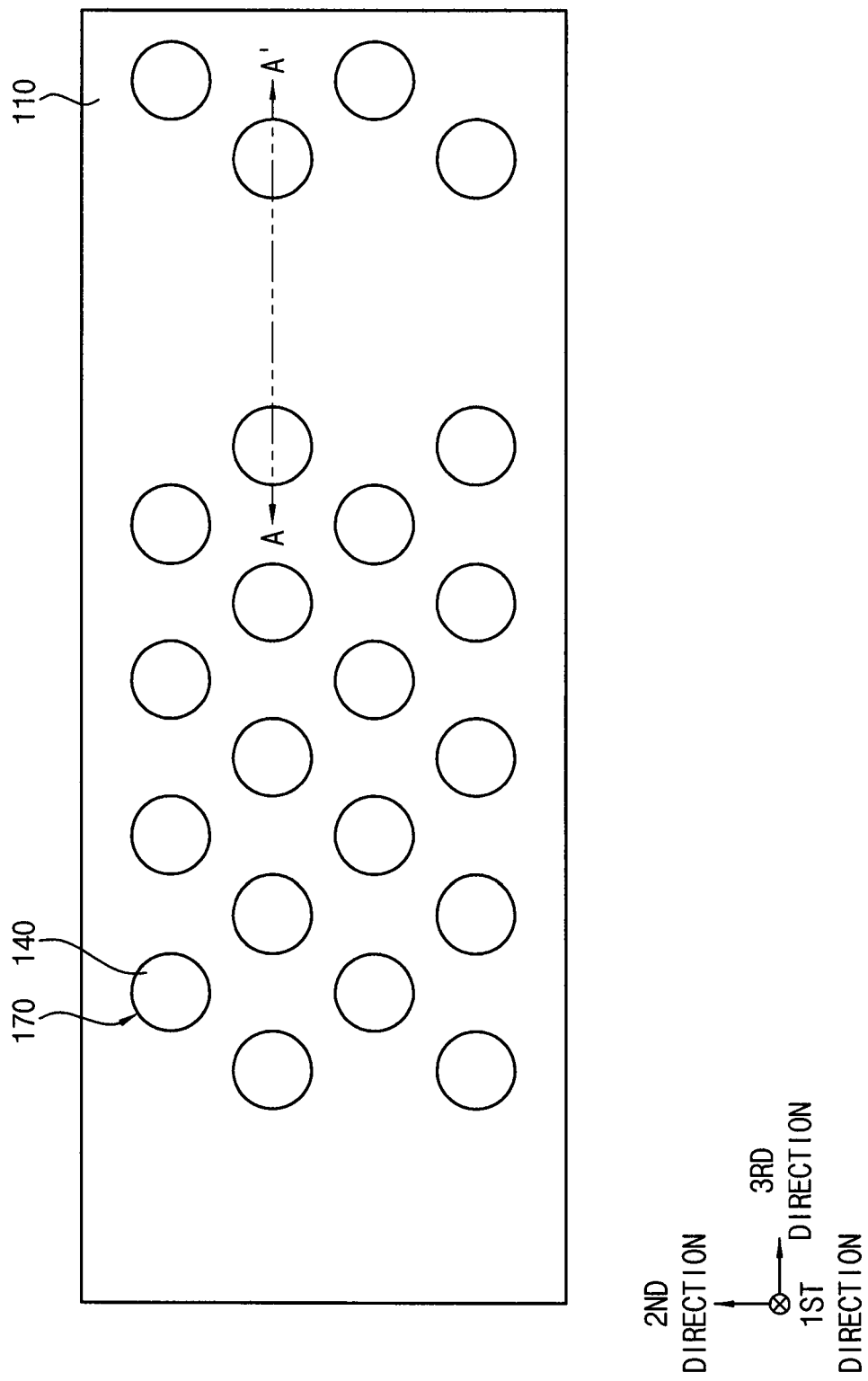
Figure 9:
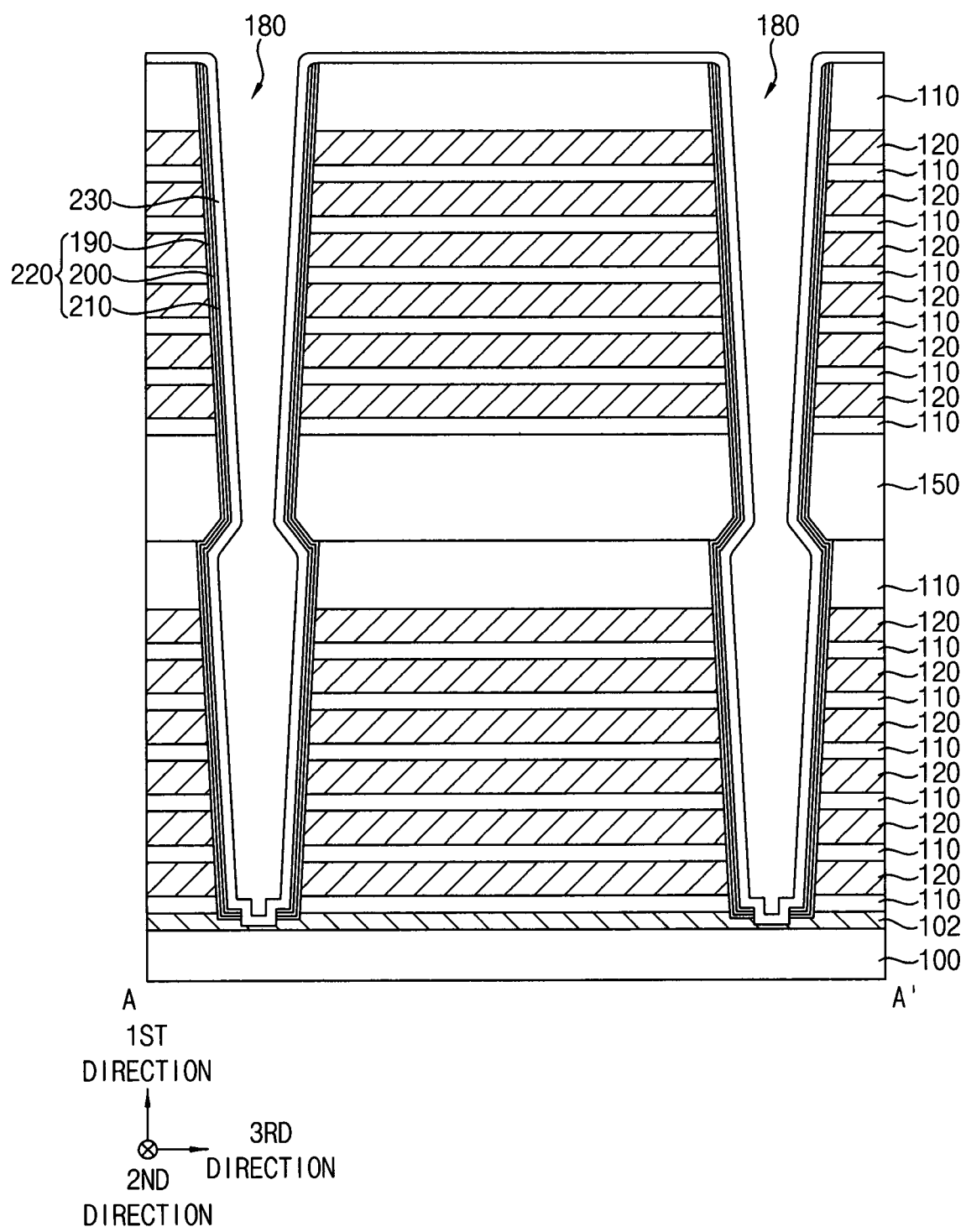
Figure 10:
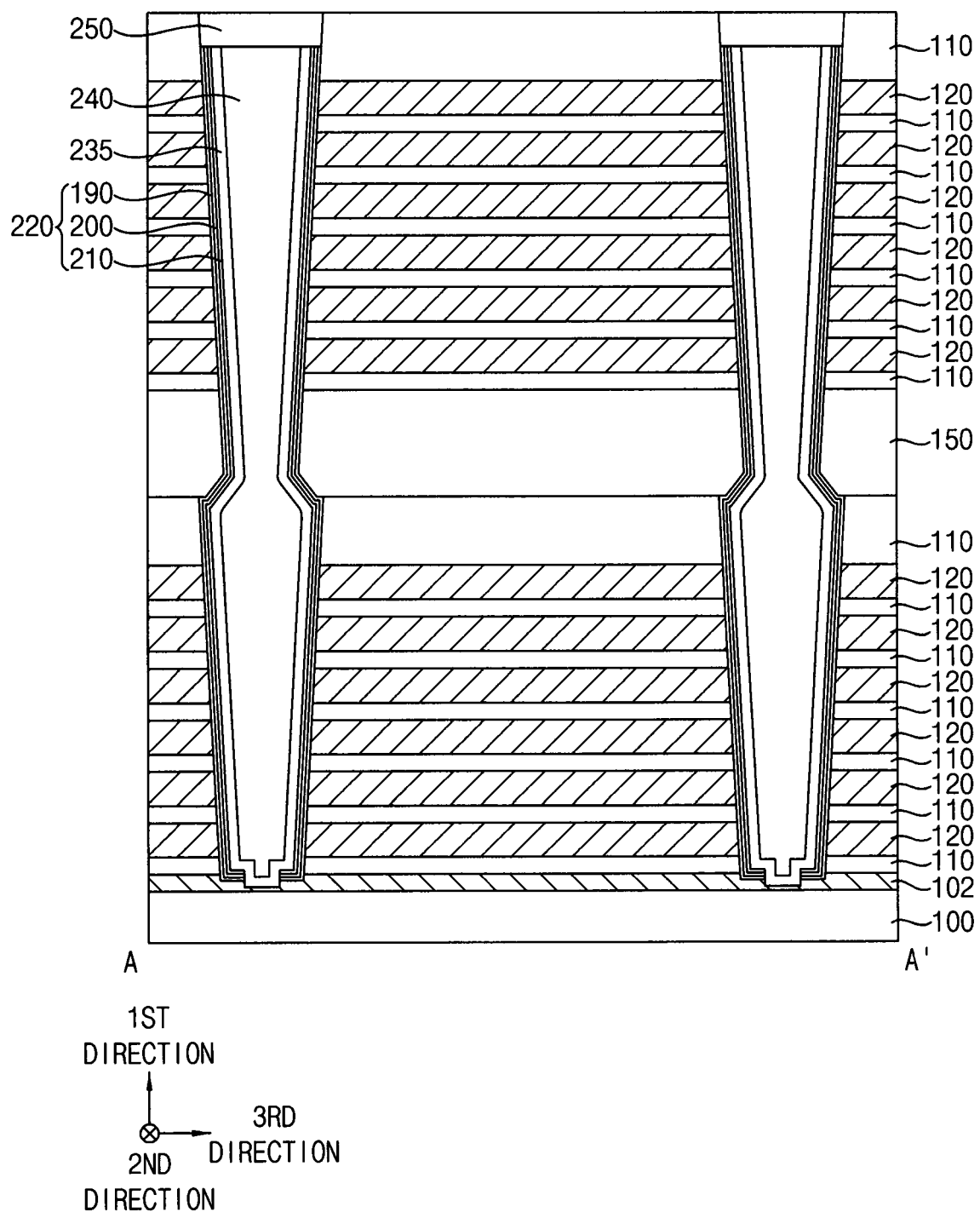
Figure 11:
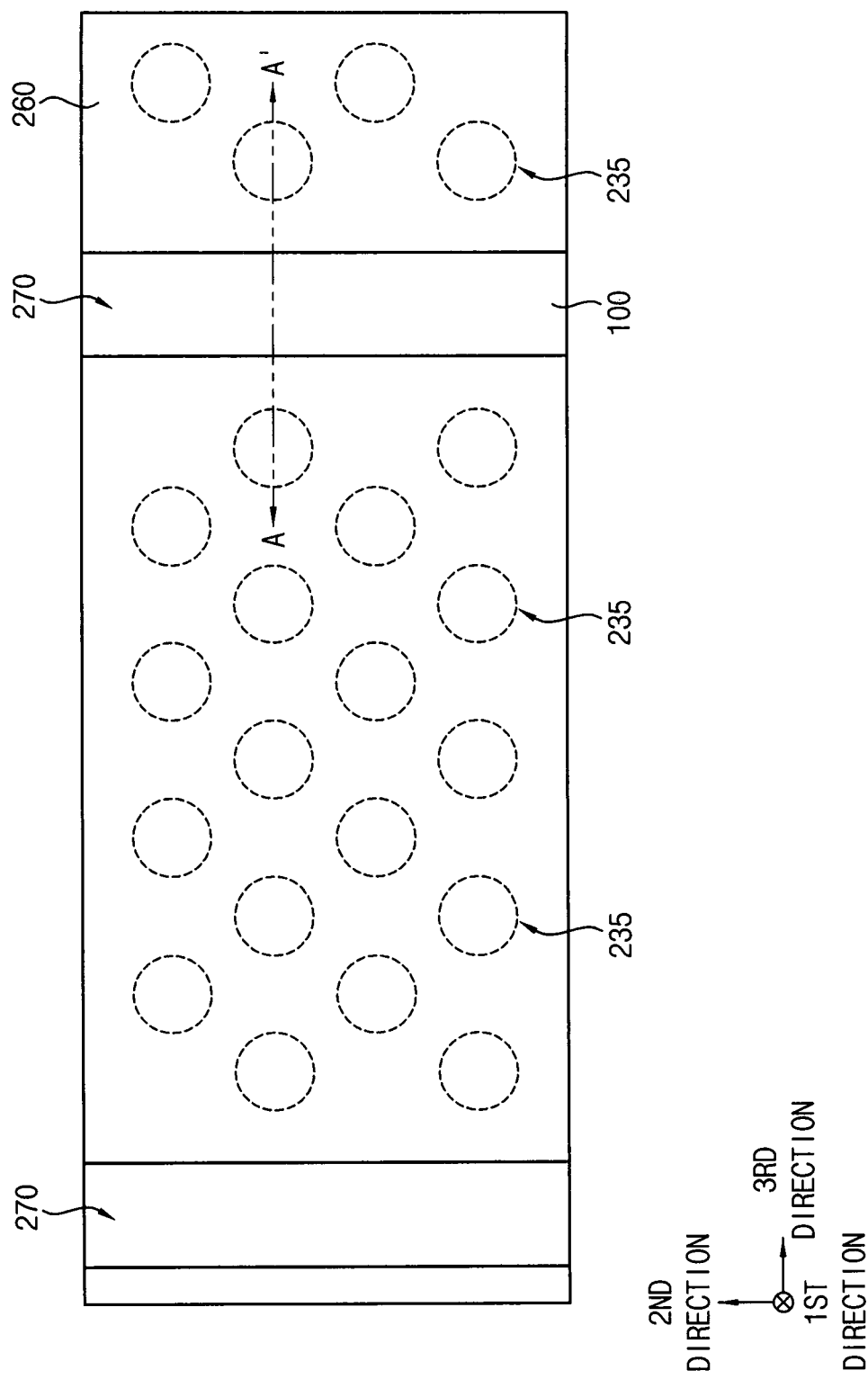

FIGS. 3 to 14 are plan views and cross-sectional views illustrating a method of manufacturing a vertical memory device in accordance with example embodiments. Particularly, FIGS. 4, 7, and 11 are the plan views, and FIGS. 3, 5-6, 8-10, and 12-14 are cross-sectional views taken along lines A-A', respectively, of corresponding plan views.

Referring to FIG. 3, a first impurity region 102 may be formed at an upper portion of a substrate 100, and insulation layers 110 and first sacrificial layers 120 may be alternately and repeatedly formed on the first impurity region 102 to form a lower mold.

The first impurity region 102 may be formed by doping carbon or n-type or p-type impurities into an upper portion of the substrate 100.

FIG. 3 shows that the lower mold includes the insulation layers 110 at seven levels, respectively, and the first sacrificial layers 120 at six levels, respectively, however, the inventive concepts may not be limited thereto. An uppermost one of the insulation layers 110 may have a thickness greater than those of ones of the insulation layers 110 at lower levels, respectively.

The insulation layers 110 and the first sacrificial layers 120 may be formed by, e.g., a chemical vapor deposition (CVD) process, a plasma enhanced chemical vapor deposition (PECVD) process, an atomic layer deposition (ALD) process, etc. The insulation layers 110 may include an oxide, e.g., silicon oxide, and the first sacrificial layers 120 may include a nitride, e.g., silicon nitride.

Referring to FIGS. 4 and 5, a first channel hole 130 may be formed through the lower mold to expose the first impurity region 102 at the upper portion of the substrate 100, and a first barrier pattern 140 may be formed on a sidewall and a bottom of the first channel hole 130.

For example, a photoresist pattern (not shown) may be formed on the uppermost one of the insulation layers 110 of the lower mold, and the insulation layers 110 and the first sacrificial layers 120 of the lower mold may be etched using the photoresist pattern as an etching mask to form the first channel hole 130 exposing an upper surface of the first impurity region 102. In example embodiments, a plurality of first channel holes 130 may be formed in each of the second and third directions.

Additionally, a first barrier layer may be formed on the sidewall and the bottom of the first channel hole 130 and an upper surface of the uppermost one of the insulation layers 110, and a portion of the first barrier layer on the upper surface of the uppermost one of the insulation layers 110 may be removed by an anisotropic etching process to form the first barrier pattern 140.

In example embodiments, the first impurity region 102 may serve as an etch stop layer during the etching process for forming the first channel holes 130. For example, impurities may be implanted into an upper portion of the substrate 100 including silicon so as to have an increased etching selectivity with respect to the insulation layers 110 and the first sacrificial layers 120 including, e.g., silicon oxide and silicon nitride, respectively. Thus, no recess may be formed on the substrate 100 during the etching process for forming the first channel holes 130, and the first channel holes 130 may have a uniform depth.

However, in some cases, the process of forming the first impurity region 102 may not be performed, but may be skipped.

In example embodiments, a width of each of the first channel holes 130 may gradually decrease from a top toward a bottom thereof due to the general characteristics of etching processes. For example, a sidewall of each of the first channel holes 130 may not be substantially perpendicular but slanted relative to the upper surface of the substrate 100. Thus, the bottom of each of the first channel holes 130 may have a fourth width W4 in a horizontal direction substantially parallel to the upper surface of the substrate 100, and the top of each of the first channel holes 130 may have a fifth width W5 in the horizontal direction greater than the fourth direction W4. The bottom of the first channel holes 130 may be the portion of the first channel holes 130 nearest to the substrate 100, and the top of the first channel holes 130 may be the portion of the first channel holes 130 farthest away from the substrate 100.

In an example embodiment, the first barrier pattern 140 may include a metal nitride, e.g., titanium nitride. In another example embodiment, the first barrier pattern 140 may include a nitride, e.g., silicon nitride or polysilicon.

Referring to FIG. 6, a connecting layer 150 may be formed on the uppermost one of the insulation layers 110 of the lower mold, and an upper portion of the connecting layer 150 may be planarized.

In example embodiments, the connecting layer 150 may include a material having a low gap-filling characteristic or a low step coverage characteristic, e.g., TEOS, HDP oxide, etc. Thus, the first channel holes 130 may not be filled with the connecting layer 150, and further a space may be formed on the first channel hole 130 to be connected thereto. For example, the space may be formed above the first channel holes 130, such that the space is formed in a lower portion of the connecting layer 150. The connecting layer 150 may not be formed in the first channel holes 130 and may not include for example, crystalline silicon, and thus the substrate 100 may not warp due to the connecting layer 150.

Hereinafter, each of the first channel holes 130 and the space thereon may be referred to as a first gap 160.

In example embodiments, an upper surface of the first gap 160 higher than an upper surface of the uppermost one of the insulation layers 110 may be slanted with respect to the upper surface of the substrate 100, and thus an upper portion of the first gap 160 may have a conic shape.

Figure 8:
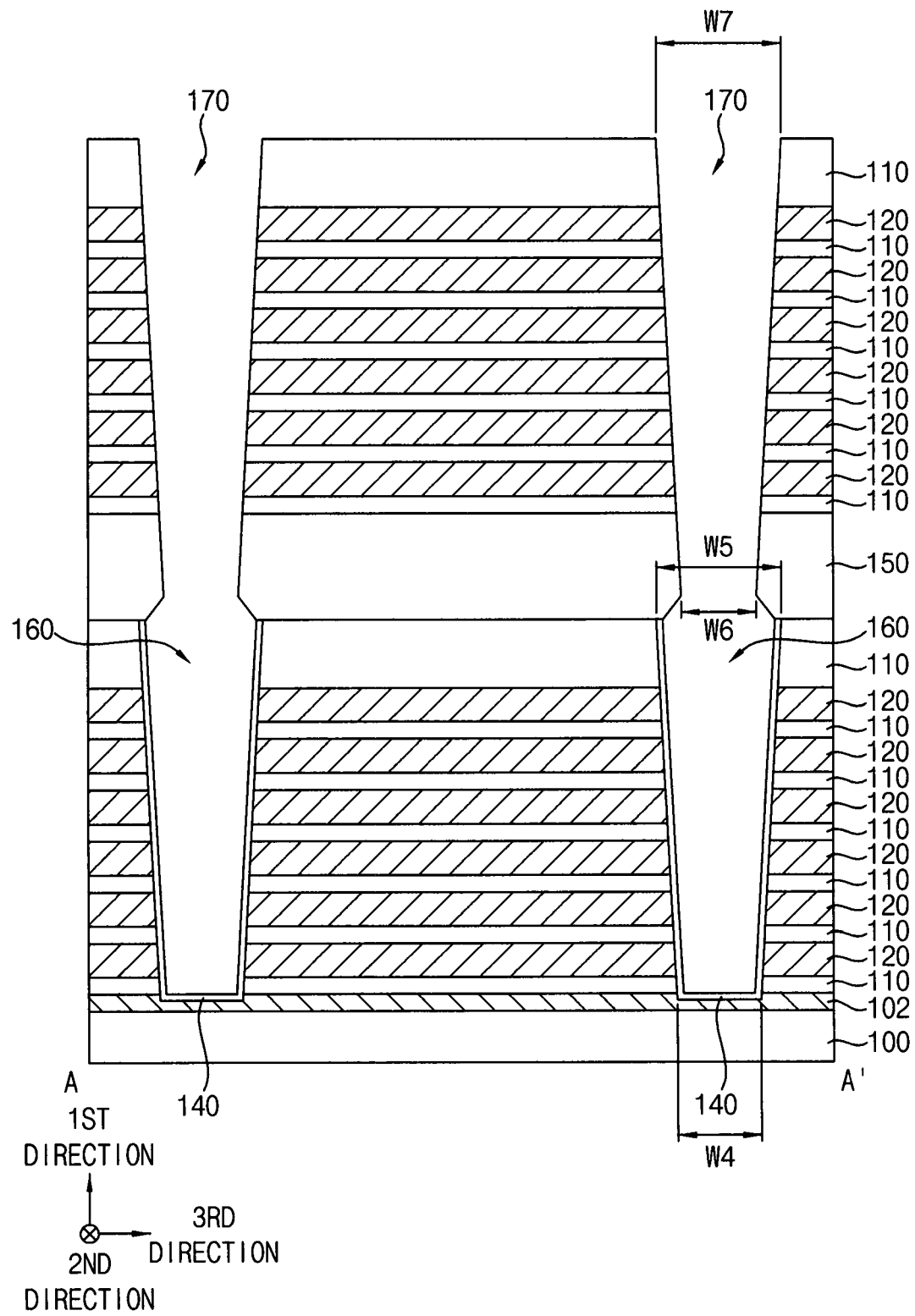

Referring to FIGS. 7 and 8, the insulation layers 110 and the first sacrificial layers 120 may be alternately and repeatedly stacked on the connecting layer 150 to form a first upper mold, and a second channel hole 170 may be formed through the first upper mold and the connecting layer 150 to expose the first gap 160.

Particularly, a photoresist pattern (not shown) may be formed on an uppermost one of the insulation layers 110 of the first upper mold, and the insulation layers 110 and the first sacrificial layers 120 of the first upper mold and the connecting layer 150 may be etched using the photoresist pattern as an etching mask to form the second channel hole 170 exposing the first gap 160. As the plurality of first channel holes 130 is formed in each of the second and third directions, a plurality of second channel holes 170 may be also formed in each of the second and third directions.

The first barrier pattern 140 may be formed on the sidewall of the first channel hole 130, and thus the insulation layers 110 and the first sacrificial layers 120 of the lower mold may not be damaged during the etching process of the first upper mold. However, the connecting layer 150 may not be formed in the first channel hole 130, and thus the possibility of damage to the insulation layers 110 and the first sacrificial layers 120 of the lower mold during the etching process may be low. Thus, in some embodiments, the first barrier pattern 140 may not be formed on the sidewall and the bottom of the first channel hole 130.

Additionally, the connecting layer 150 may not be formed in the first channel hole 130, and thus an additional etching process for removing the connecting layer 150 may not be performed. Thus, a barrier pattern for protecting the insulation layers 110 and the first sacrificial layers 120 of the first upper mold during the etching process may not be formed on a sidewall of the second channel hole 170.

Like the first channel hole 130, the second channel hole 170 may also have a width gradually decreasing from a top toward a bottom thereof due to the general characteristics of etching processes, and a sidewall of the second channel hole 170 may not be substantially perpendicular but slanted relative to the upper surface of the substrate 100. Accordingly, the bottom of the second channel hole 170 may have a sixth width W6 in the horizontal direction, and the top of the second channel hole 170 may have a seventh width W7 in the horizontal direction greater than the sixth width W6. In example embodiments, the seventh width W7 may be substantially equal to the fifth width W5, and thus the sixth width W6 may be less than the fifth width W5.

Hereinafter, the first gap 160 and the second channel hole 170 connected thereto may be referred to as a third channel hole 180.

Referring to FIG. 9, after the first barrier pattern 140 is removed to expose the upper surface of the first impurity region 102, a charge storage structure 220 may be formed on a sidewall of the third channel hole 180 and a portion of the exposed upper surface of the first impurity region 102, and a channel layer 230 may be formed on the charge storage structure 220, a portion of the exposed upper surface of the first impurity region 102, and the uppermost one of the insulation layers 110 of the first upper mold.

For example, a charge storage structure layer and a second sacrificial layer may be sequentially formed on the sidewall of the third channel hole 180, the exposed upper surface of the first impurity region 102, and an upper surface of the uppermost one of the insulation layers 110 of the first upper mold, then a first spacer layer (not shown) may be formed on the second sacrificial layer, and the first spacer layer may be anisotropically etched to form a first spacer (not shown) only on the sidewall of the third channel hole 180.

The second sacrificial layer and the charge storage structure layer may be etched using the first spacer as an etching mask to form a second sacrificial pattern (not shown) and the charge storage structure 220, respectively, having a cup-like shape of which a bottom is opened on the sidewall of the third channel hole 180 and the upper surface of the first impurity region 102. An upper portion of the exposed first impurity region 102 may be also partially removed.

After removing the first spacer and the second sacrificial pattern, a channel layer 230 may be formed on the first impurity region 102, the charge storage structure 220, and the uppermost one of the insulation layers 110 of the first upper mold.

In example embodiments, the charge storage structure 220 may include a first blocking pattern 190, a charge storage pattern 200 and a tunnel insulation pattern 210 sequentially stacked. For example, the first blocking pattern 190, the charge storage pattern 200 and the tunnel insulation pattern 210 may include silicon oxide, silicon nitride and silicon oxide, respectively. The second sacrificial layer may include, e.g., polysilicon, and the first spacer may include, e.g., silicon oxide or silicon nitride.

The channel layer 230 may include polysilicon or amorphous silicon. When the channel layer 230 includes amorphous silicon, the channel layer 230 may be converted into crystalline silicon by heat generated during the processes of forming other layers. Alternatively, a laser epitaxial growth (LEG) process or a solid phase epitaxy (SPE) process may be further performed so that amorphous silicon may be converted into crystalline silicon.

Referring to FIG. 10, a filling layer may be formed on the channel layer 230 to fill a remaining portion of the third channel hole 180, and the filling layer and the channel layer 230 may be planarized until the upper surface of the uppermost one of the insulation layers 110 of the first upper mold is exposed, thereby forming a filling pattern 240 filling the remaining portion of the third channel hole 180 and transforming the channel layer 230 into a channel 235.

Accordingly, the charge storage structure 220, the channel 235, and the filling pattern 240 may be sequentially stacked on the first impurity region 102 in the third channel hole 180.

The channel 235 having a cup-like shape of which a bottom is opened, the charge storage structure 220 covering an outer sidewall of the channel 235, and the filling pattern 240 filling an inner space formed by an inner sidewall of the channel 235 may form a first structure having a pillar shape.

An upper portion of the first structure may be removed to form a trench, and a pad 250 may be formed to fill the trench.

In example embodiments, the pad 250 may include doped polysilicon or amorphous silicon, and when the pad 250 includes amorphous silicon, a crystallization process may be further performed thereon.

Hereinafter, the first structure and the pad 250 thereon may be referred to as a second structure.

Figure 12:
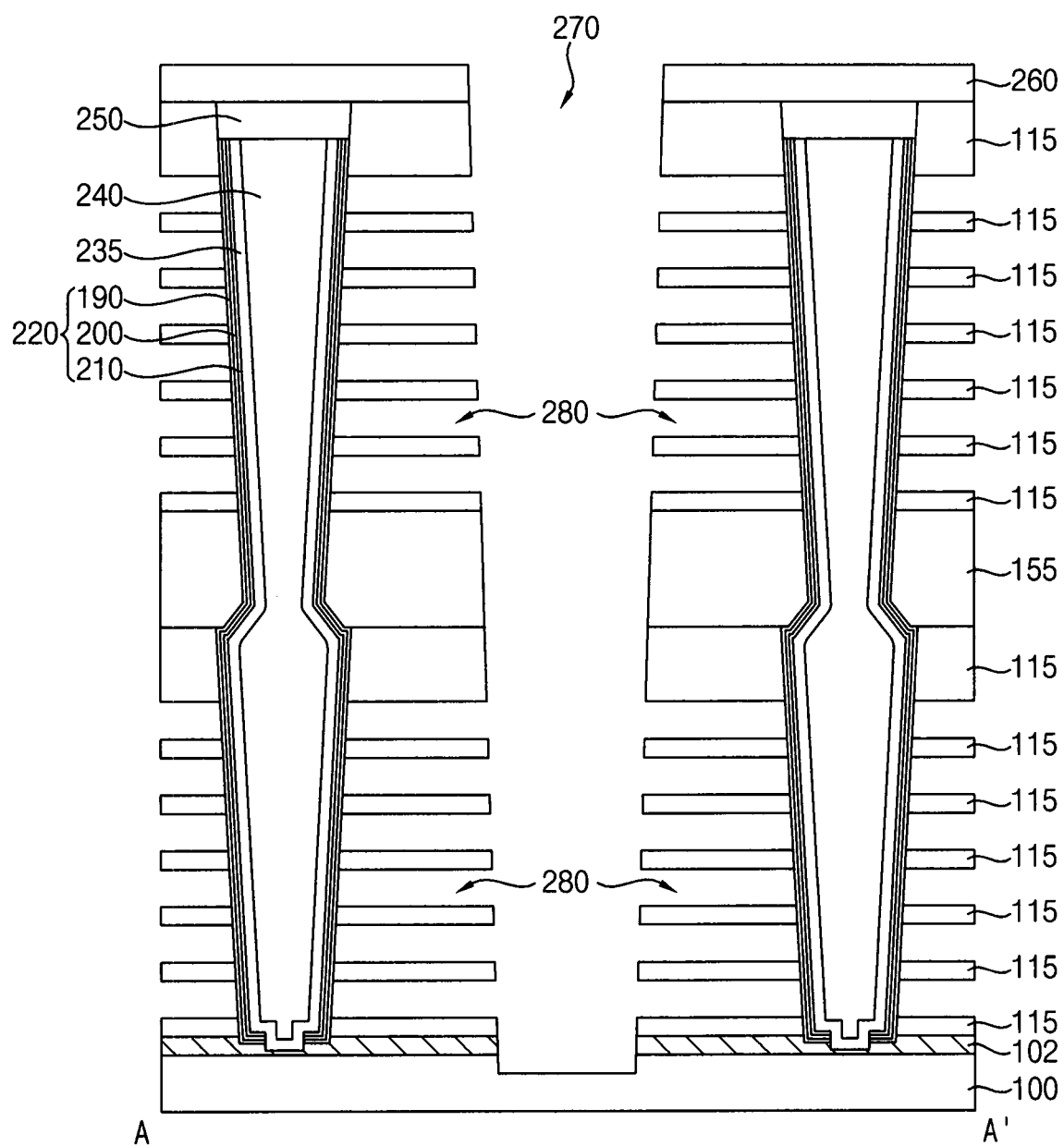

Referring to FIGS. 11 and 12, a first insulating interlayer 260 may be formed on the uppermost one of the insulation layers 110 and the pad 250, and an opening 270 may be formed through the first insulating interlayer 260, the insulation layers 110, the first sacrificial layers 120, and the first impurity region 102. During the formation of the opening 270, a portion of the substrate 100 under the first impurity region 102 may be also partially removed.

In example embodiments, the opening 270 may extend lengthwise in the second direction, and a plurality of openings 270 may be formed in the third direction.

As the opening 270 is formed, the insulation layers 110 may be transformed into insulation patterns 115 each extending in the second direction, the first sacrificial layer 120 may be transformed into first sacrificial patterns (not shown) each extending in the second direction, and the connecting layer 150 may be transformed into connecting patterns 155 each extending in the second direction.

The first sacrificial patterns exposed by the opening 270 may be removed to form a second gap 280 between neighboring ones of the insulation patterns 115 at respective levels. A portion of an outer sidewall of the first blocking pattern 190 may be exposed by the second gap 280.

In example embodiments, the first sacrificial patterns exposed by the opening 270 may be removed by a wet etching process using a solution including phosphoric acid or sulfuric acid.

Figure 13:
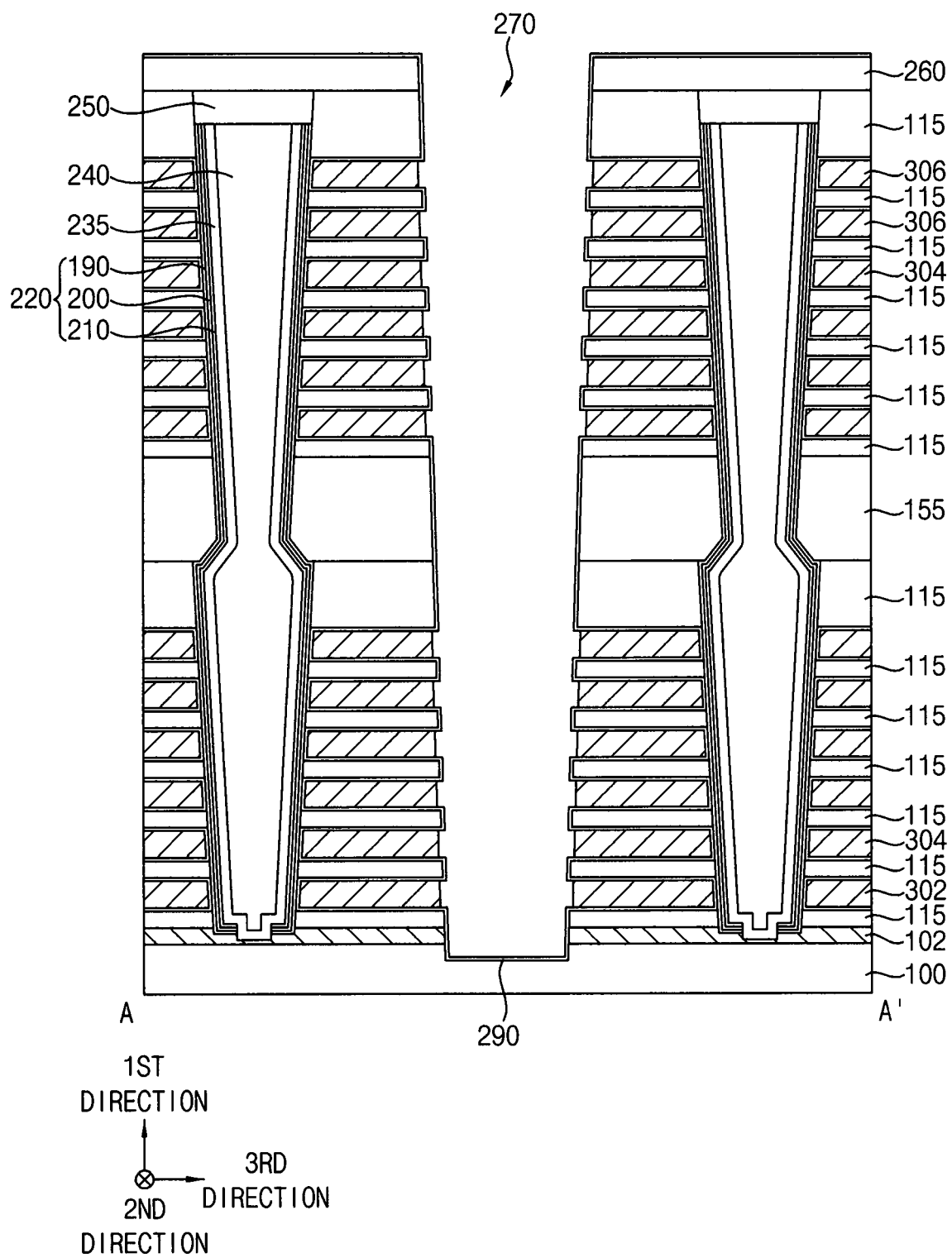

Referring to FIG. 13, a second blocking layer 290 may be formed on the exposed outer sidewall of the first blocking pattern 190, an inner wall of the second gap 280, a surface of the insulation pattern 115, the upper surface of the substrate 100, and an upper surface of the first insulating interlayer 260, and gate electrodes may be formed on the second blocking layer 290 to at least partially fill the second gap 280.

The gate electrodes may be formed by forming a gate electrode layer on the second blocking layer 290 to sufficiently fill the second gap 280 and partially removing the gate electrode layer. In example embodiments, the gate electrode layer may be partially removed by a wet etching process.

In example embodiments, the second blocking layer 290 may include a metal oxide, e.g., aluminum oxide, hafnium oxide, zirconium oxide, etc. The gate electrode may include a gate conductive pattern and a gate barrier pattern covering lower and upper surfaces and a sidewall of the gate conductive pattern. The gate conductive pattern may include a low resistance metal, e.g., tungsten, titanium, tantalum, etc., and the gate barrier pattern may include a metal nitride, e.g., titanium nitride, tantalum nitride, etc.

The gate electrode may extend in the second direction, and a plurality of gate electrodes may be formed in the third direction. For example, the gate electrodes, each of which may extend in the second direction, may be spaced apart from each other by the opening 270 extending in the second direction.

In example embodiments, the gate electrodes may be formed at a plurality of levels spaced apart from each other in the first direction, and the gate electrodes at the plurality of levels may form a gate electrode structure. The gate electrode structure may include at least one first gate electrode 302, a plurality of second gate electrodes 304, and at least one third gate electrode 306. The number of levels at which the first to third gate electrodes 302, 304 and 306 are formed may be changed according to the number of levels of the first sacrificial layers 120.

FIG. 13 shows that the first gate electrode 302 is formed at one level, the second gate electrode 304 is formed at nine levels, and the third gate electrode 306 is formed at two levels, however, the inventive concepts may not be limited thereto.

In example embodiments, the first gate electrode 302 may serve as a ground selection line (GSL), the second gate electrode 304 may serve as a word line, and the third gate electrode 306 may serve as a string selection line (SSL). Some of the second gate electrodes 304 adjacent to the first gate electrode 302 and/or the third gate electrode 306 may serve as dummy word lines.

Figure 14:
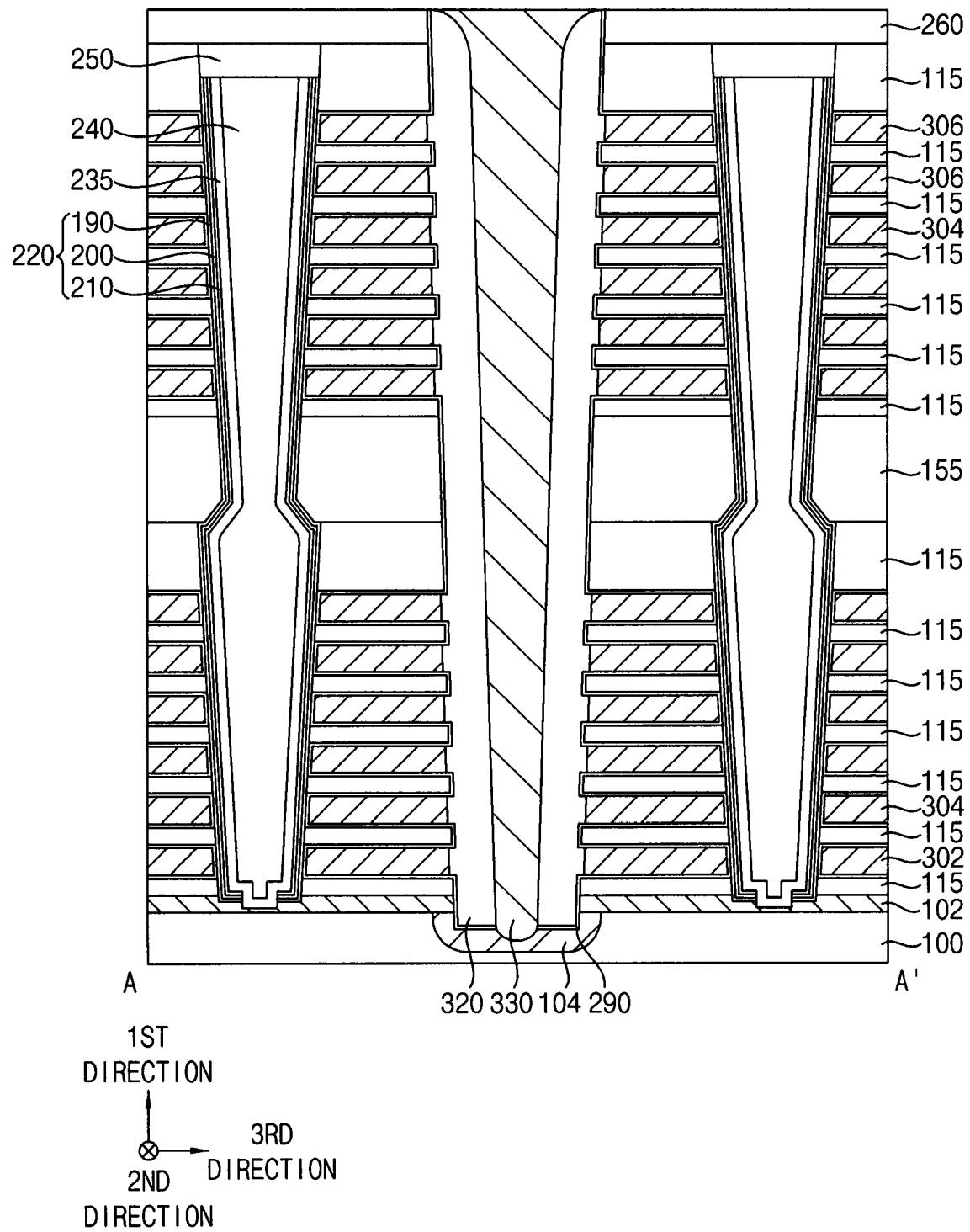

Referring to FIG. 14, impurities may be implanted into an upper portion of the substrate 100 through a portion of the second blocking layer 290 on a bottom of the opening 270 to form a second impurity region 104. In example embodiments, the impurities may include n-type impurities, e.g., phosphorus, arsenic, etc.

A second spacer layer may be formed on the second blocking layer 290, and may be anisotropically etched to form a second spacer 320 on a sidewall of the opening 270, and thus a portion of the second blocking layer 290 on the second impurity region 104 may be exposed.

A portion of the second blocking layer 290 not covered by the second spacer 320 may be etched, and a portion of the second blocking layer 290 on the upper surface of the first insulating interlayer 260 may be also removed. During the etching process, a portion of the second impurity region 104 at the upper portion of the substrate 100 may be also partially removed.

A conductive layer may be formed on an upper surface of the second impurity region 104, the second spacer 320 and the first insulating interlayer 260 to fill a remaining portion of the opening 270, and may be planarized until the upper surface of the first insulating interlayer 260 is exposed to form a common source line (CSL) 330.

In example embodiments, the CSL 330 may extend in the first direction, and also in the second direction. A lower surface of the CSL 330 may be covered by the second impurity region 104.

Referring to FIGS. 1, 2A and 2B again, after forming a second insulating interlayer 340 on the first insulating interlayer 260, the CSL 330, the second spacer 320, and the second blocking layer 290, a contact plug 350 may be formed through the first and second insulating interlayers 260 and 340 to contact an upper surface of the pad 250. A third insulating interlayer 360 may be formed on the second insulating interlayer 340 and the contact plug 350, and a bit line 370 may be formed through the third insulating interlayer 360 to contact an upper surface of the contact plug 350.

In example embodiments, the bit line 370 may extend lengthwise in the third direction, and a plurality of bit lines 370 may be formed in the second direction.

The vertical memory device may be manufactured by the above processes.

As illustrated above, the first impurity region 102 may be formed at an upper portion of the substrate 100, the insulation layer 110 and the first sacrificial layer 120 may be alternately and repeatedly stacked at a plurality of levels, respectively, to form the lower mold, and the first channel holes 130 may be formed through the lower mold to expose the first impurity region 102. The first impurity region 102 may serve as an etch stop layer, and thus the first channel holes 130 may have a uniform depth.

The connecting layer 150 including low gap-filling characteristics (e.g., TEOS) may be formed on the lower mold, and thus the connecting layer 150 may not be formed in the first channel holes 130. Accordingly, for example, a crystalline silicon layer may not be formed in the first channel holes 130, and thus the warpage of the substrate 100 may be prevented.

The insulation layers 110 and the first sacrificial layers 120 may be alternately and repeatedly stacked at a plurality of levels, respectively, on the connecting layer 150 to form the first upper mold, and the second channel holes 170 may be formed through the first upper mold to expose the first channel holes 130, respectively. The connecting layer 150 may not be formed in the first channel holes 130, and thus no barrier pattern for preventing the first upper mold from being damaged during the removal of the connecting layer 150 may be formed on the sidewalls of the second channel holes 170. Thus, the profile of the channel 235 on the sidewall of the third channel hole 180 including the first and second channel holes 130 and 170 may be prevented from being deteriorated due to the barrier pattern.

FIGS. 15A to 15E and 16 are cross-sectional views illustrating vertical memory devices in accordance with example embodiments. Each of FIGS. 15A to 15E and 16 are an enlarged cross-sectional view of the region X of FIG. 2A.

The vertical memory device may be substantially the same as or similar to that of FIGS. 1 and 2A, except for the shape of the channel and/or the connecting pattern. Thus, like reference numerals refer to like elements, and detailed descriptions thereof are omitted herein.

Figure 15A:
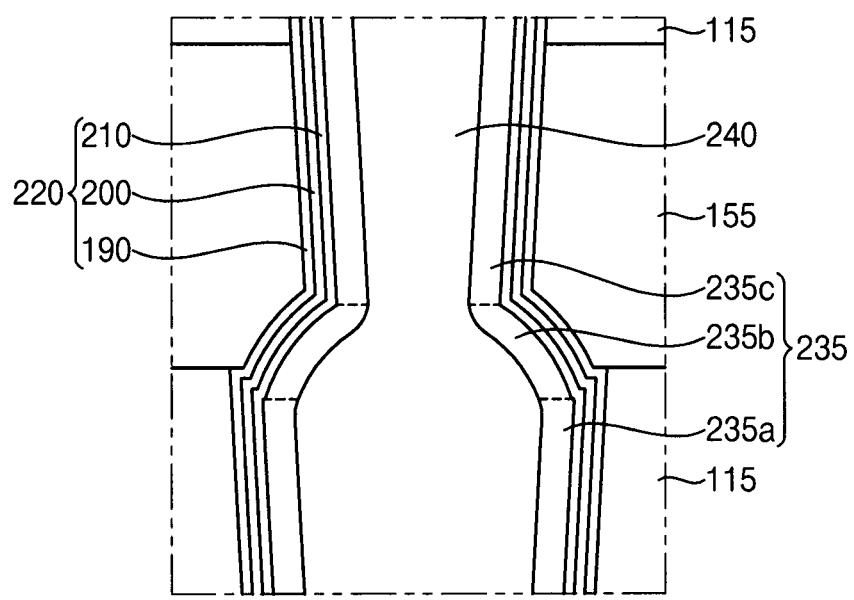
FIGS. 15A to 15E and 16 are cross-sectional views illustrating vertical memory devices in accordance with example embodiments.
Figure 15B:
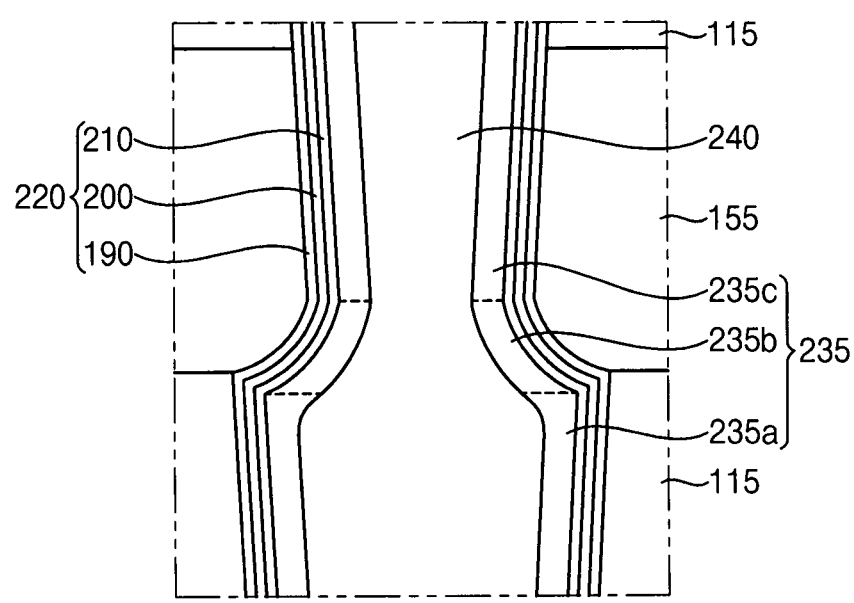

Referring to FIGS. 15A and 15B, a sidewall of the second portion 235b of the channel 235 may have a slope with respect to the upper surface of the substrate 100 that may vary according to a position thereof.

For example, the sidewall of the second portion 235b of the channel 235 shown in FIG. 15A may have a slope with respect to the upper surface of the substrate 100 that may gradually decrease from a bottom toward a top thereof, and the sidewall of the second portion 235b of the channel 235 shown in FIG. 15B may have a slope with respect to the upper surface of the substrate 100 that may gradually increase from a bottom toward a top thereof.

The shapes of the second portion 235b shown in FIGS. 15A and 15B may be determined by the shape of the space on the first channel hole 130 during the formation of the connecting layer 150 illustrated with reference to FIG. 6.

Figure 15C:
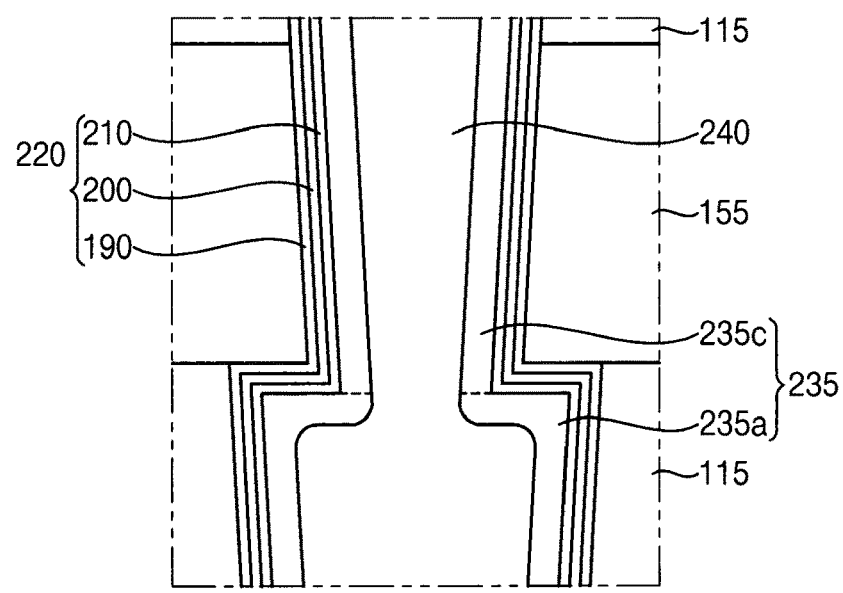

Referring to FIG. 15C, the channel 235 may include only the first and third portions 235a and 235c, and may not include the second portion 235b.

The channel 235 including only the first and third portions 235a and 235c may be implemented when the connecting layer 150 does not fill the first channel hole 130 but fills the space on the first channel hole 130 during the formation of the connecting layer 150.

Figure 15D:
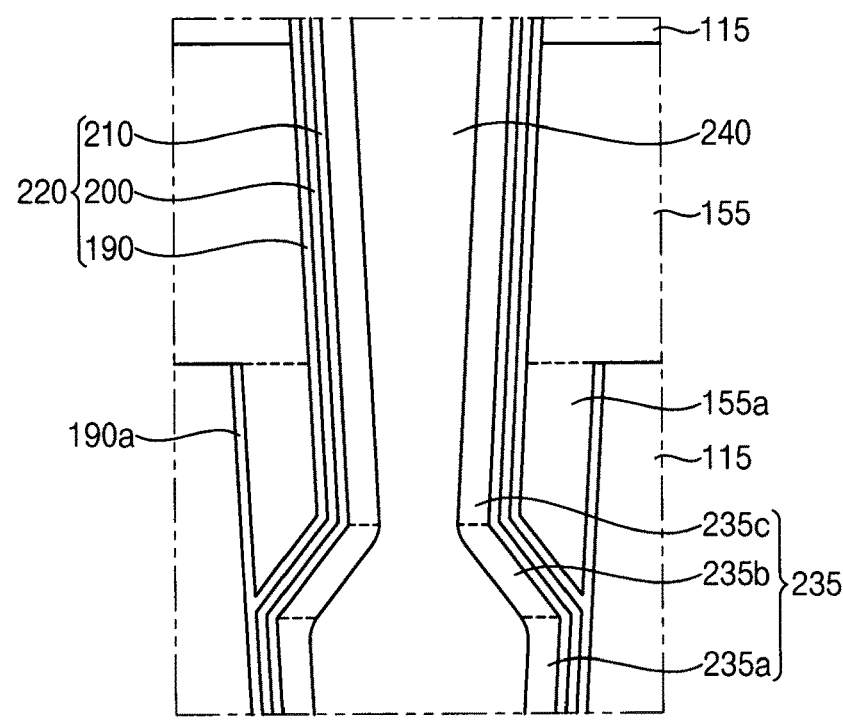
Figure 15E:
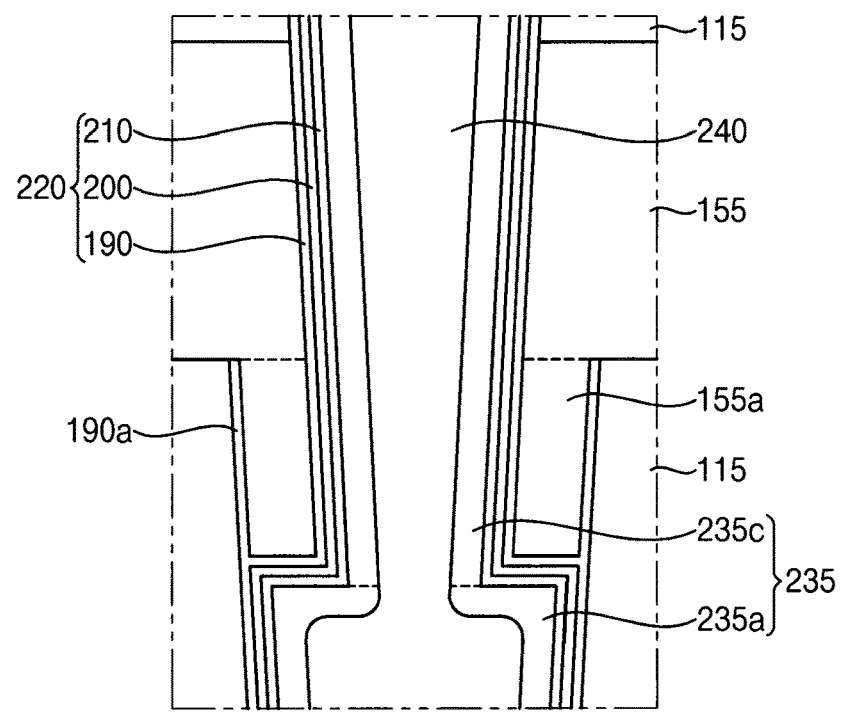

Referring to FIGS. 15D and 15E, the connecting pattern 155 may be also formed at an upper portion of the first channel hole 130, and thus may include a first protrusion 155a having a lower surface lower than an upper surface of the insulation pattern 115 under the connecting pattern 155.

In FIG. 15D, the first protrusion 155a of the connecting pattern 155 may be adjacent to and surround the second and third portions 235b and 235c of the channel 235.

In FIG. 15E, the channel 235 may not include the second portion 235b, and thus the first protrusion 155a of the connecting pattern 155 may be adjacent to and surround the third portion 235c of the channel 235.

In FIGS. 15D and 15E, the first blocking pattern 190 of the charge storage structure 220 may further include a second protrusion 190a that may protrude upwardly from a portion thereof covering the first portion 235a of the channel 235 to cover an outer sidewall of the first protrusion 155a of the connecting pattern 155. For example, second protrusion 190a of the first blocking pattern 190 of the charge storage structure 220 may protrude upwardly and does not contact the outer sidewall of the channel 235.

Figure 16:
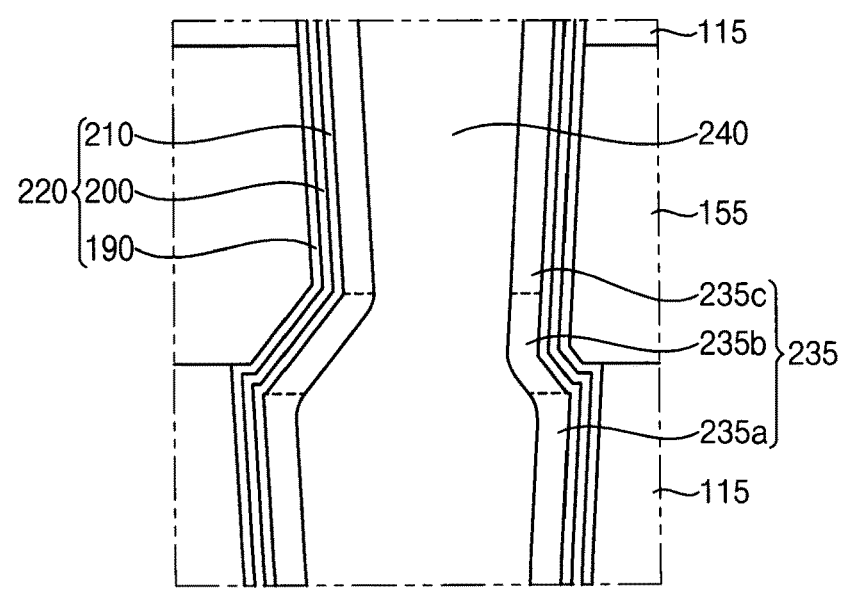

Referring to FIG. 16, the second portion 235b of the channel 235 between the first and third portions 235a and 235c thereof may not be symmetric with respect to a vertical line.

The non-symmetric second portion 235b of the channel 235 may be formed when the second channel hole 170 is not well aligned with the first channel hole 130 but shifted during the formation of the second channel hole 170.

Figure 17A:
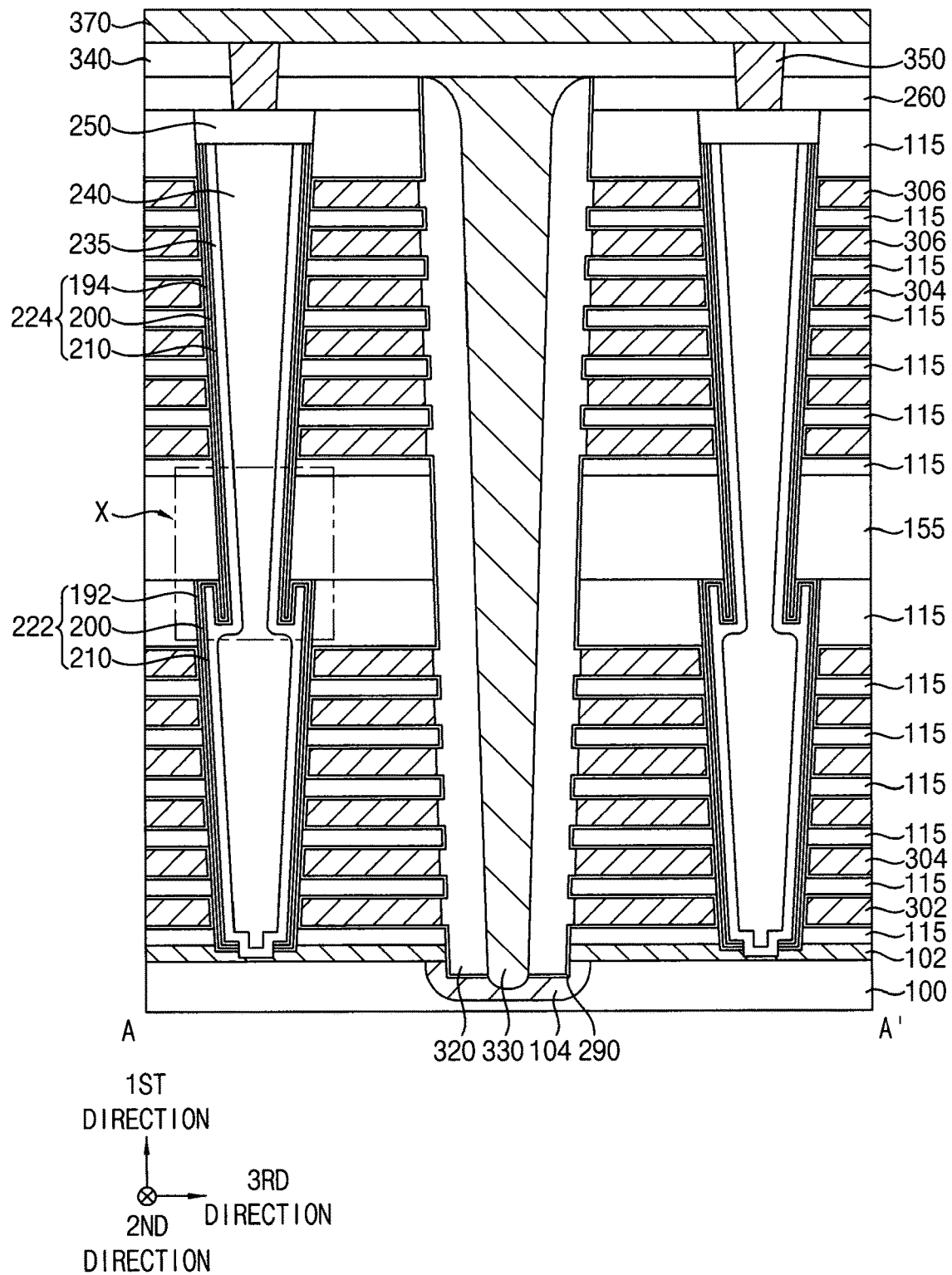
FIGS. 17A and 17B are cross-sectional views illustrating vertical memory devices in accordance with example embodiments.
Figure 17B:
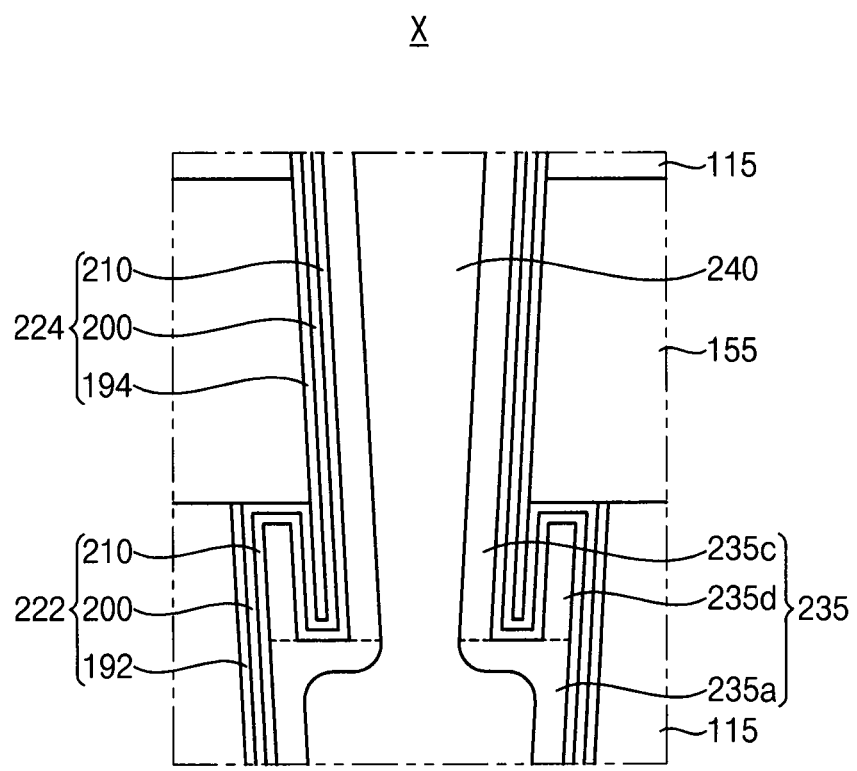

FIG. 17A is a cross-sectional view illustrating vertical memory devices in accordance with example embodiments. FIG. 17B is an enlarged cross-sectional view of the region X of FIG. 17A.

The vertical memory device may be substantially the same as or similar to that of FIGS. 1 and 2A to 2B, except for the shape of the channel, the charge storage structure, and the connecting pattern. Thus, like reference numerals refer to like elements, and detailed descriptions thereof are omitted herein.

Referring to FIGS. 17A and 17B, the channel 235 may include the first portion 235a, the third portion 235c, and a third protrusion 235d. For example, unlike the channel 235 shown in FIGS. 1 and 2A to 2B, the channel 235 may not include the second portion 235b but may include the third protrusion 235d. The first and second portions 235a and 235b and the third protrusion 235d may be in material continuity with one another.

In example embodiments, the third protrusion 235d of the channel 235 may upwardly protrude from an upper surface of the first portion 235a of the channel 235, and an upper surface of the third protrusion 235d may be lower than the upper surface of the insulation pattern 115 under the connecting pattern 155.

In example embodiments, the vertical memory device may include first and second charge storage structures 222 and 224 sequentially stacked, and the first charge storage structure 222 may include the tunnel insulation pattern 210, the charge storage pattern 200, and a first lower blocking pattern 192 sequentially stacked from a lower outer sidewall of the channel 235 in a horizontal direction substantially parallel to the upper surface of the substrate 100, and the second charge storage structure 224 may include the tunnel insulation pattern 210, the charge storage pattern 200, and a first upper blocking pattern 194 sequentially stacked from an upper outer sidewall of the channel 235 in the horizontal direction.

For example, the tunnel insulation pattern 210 and the charge storage pattern 200 may be continuously formed in the first direction to cover the outer sidewall of the channel 235, while the first blocking pattern may be divided into the first lower and upper blocking patterns 192 and 194 that may be disconnected and spaced apart from each other.

In example embodiments, the first lower blocking pattern 192 may cover an outer sidewall of the third protrusion 235d of the channel 235, and an upper surface of the first lower blocking pattern 192 may be substantially coplanar with an upper surface of the insulation pattern 115 under the connecting pattern 155. A lower surface of the first upper blocking pattern 194 may be lower than the upper surface of the insulation pattern 115 under the connecting pattern 155.

The connecting pattern 155 may not be formed in the first channel hole 130, however, the connecting pattern 155 may entirely fill the space on the first channel hole 130 (see FIG. 6).

Figure 18:
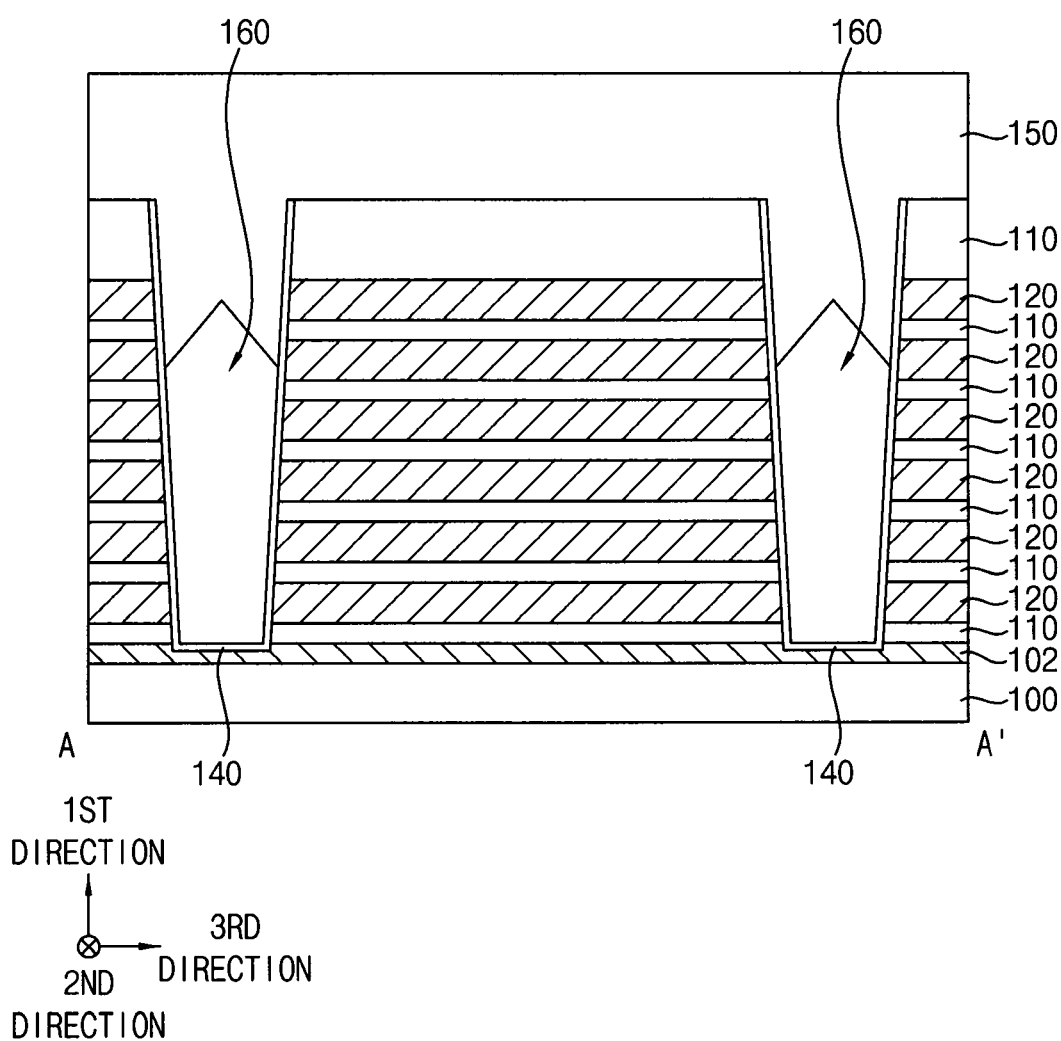
FIGS. 18 to 20 are cross-sectional views illustrating a method of manufacturing a vertical memory device in accordance with example embodiments.
Figure 19:
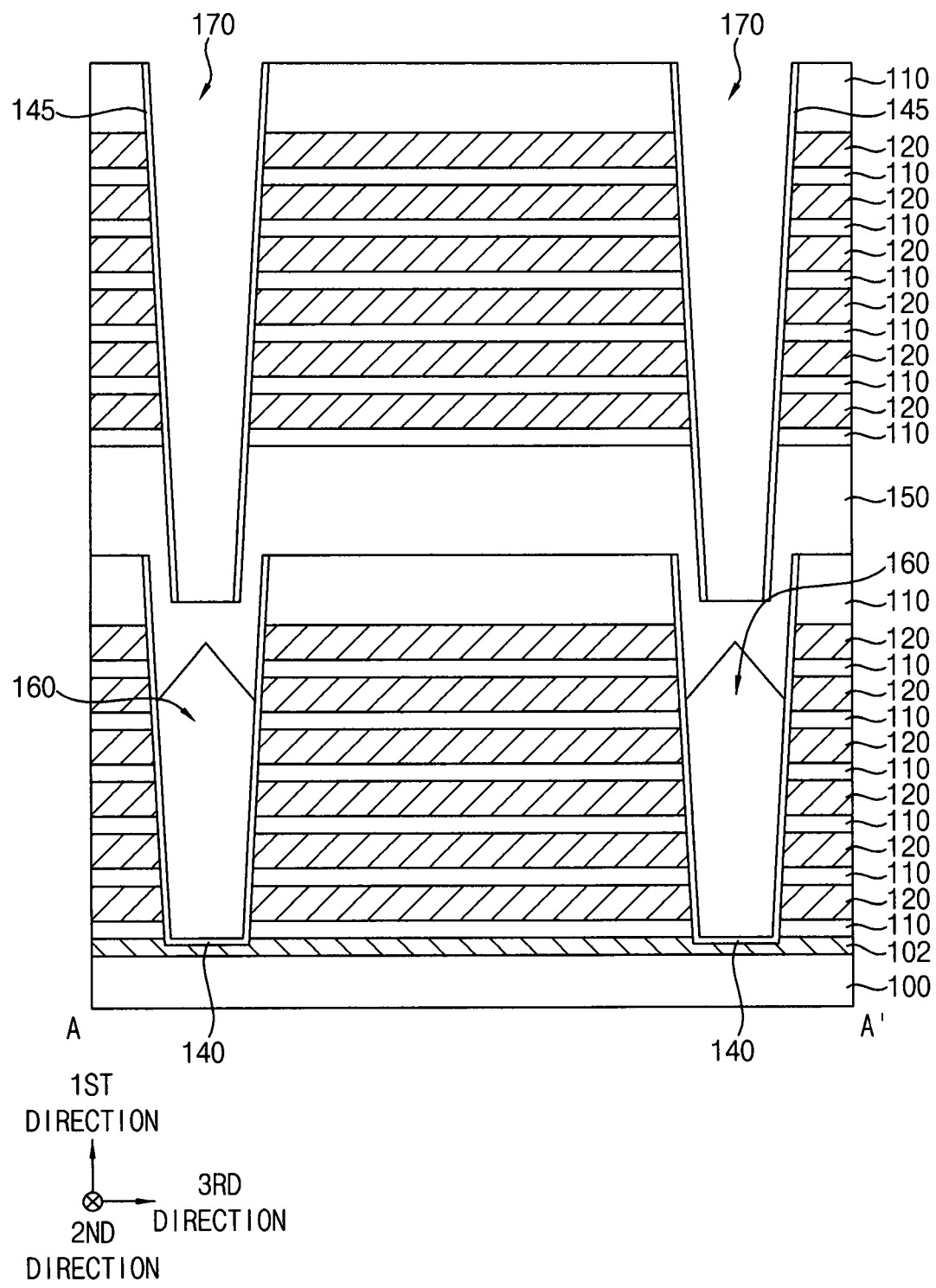
Figure 20:
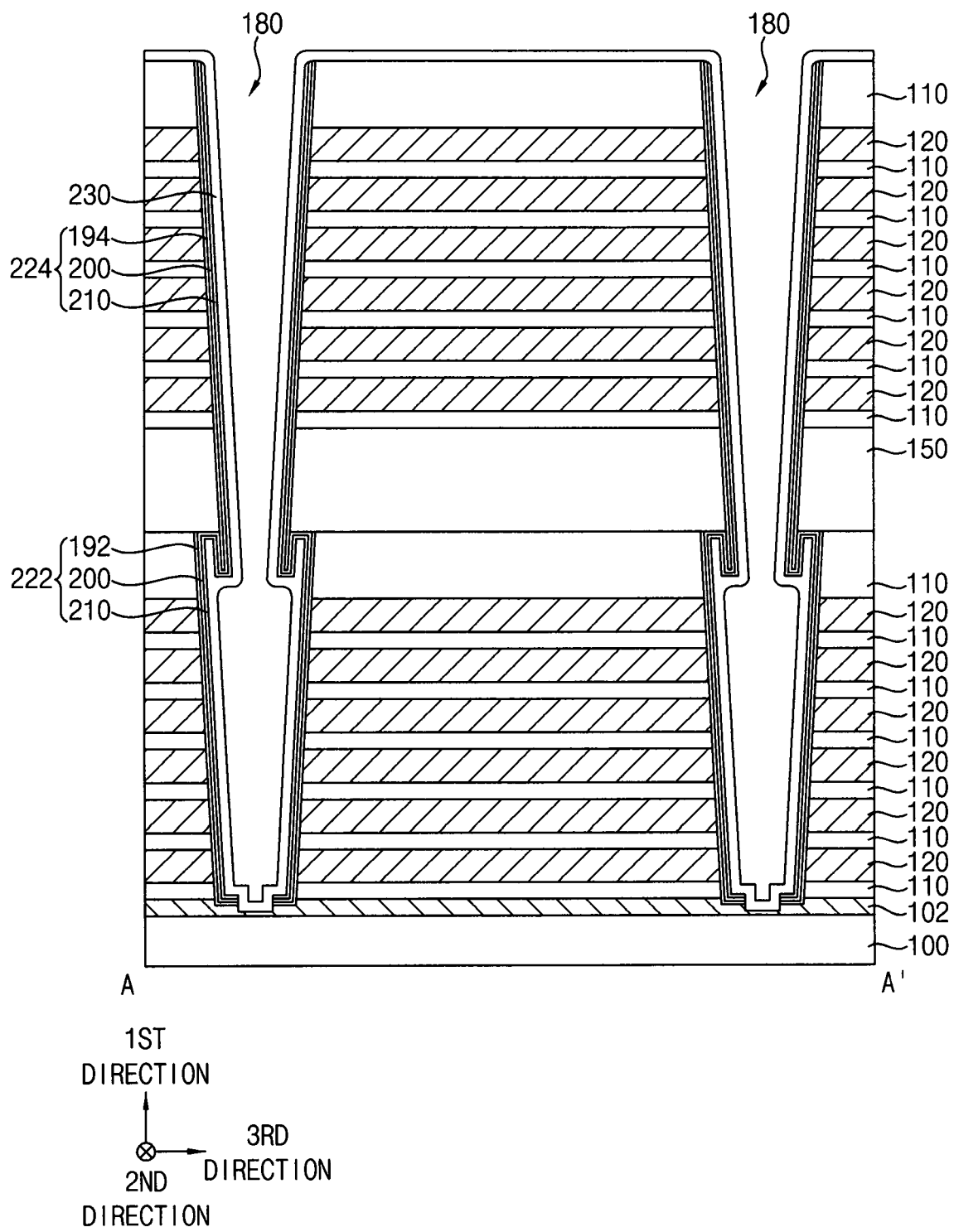

FIGS. 18 to 20 are cross-sectional views illustrating a method of manufacturing a vertical memory device in accordance with example embodiments. This method may include processes substantially the same as or similar to those illustrated with reference to FIGS. 3 to 14 and FIGS. 1 and 2A to 2B, and detailed descriptions thereof are omitted herein.

Referring to FIG. 18, processes substantially the same as or similar to those illustrated with reference to FIGS. 3 to 6 may be performed.

However, the first barrier pattern 140 may include polysilicon or silicon nitride instead of a metal nitride.

Additionally, the connecting layer 150 may fill an upper portion of the first channel hole 130, and thus an upper surface of the first gap 160 may be lower than an upper surface of the first channel hole 130.

Referring to FIG. 19, processes substantially the same as or similar to those illustrated with reference to FIGS. 7 and 8 may be performed.

However, the second channel hole 170 may not be connected to the first gap 160. For example, the second channel hole 170 may be formed to partially extend through a portion of the connecting layer 150 in the first channel hole 130, and may not expose the first gap 160 thereunder.

After forming the second channel hole 170, a second barrier pattern 145 may be further formed on a sidewall of the second channel hole 170. The second barrier pattern 145 may include a material substantially the same as that of the first barrier pattern 140, e.g., polysilicon or silicon nitride.

Referring to FIG. 20, a portion of the connecting layer 150 exposed by the second channel hole 170 in the first channel hole 130 may be removed to form a third channel hole 180, and an oxidation process may be performed on the first and second barrier patterns 140 and 145.

Thus, the first and second barrier patterns 140 and 145 may include an oxide, and may be converted into a first lower blocking pattern 192 and a first upper blocking pattern 194, respectively.

Processes substantially the same as or similar to those illustrated with reference to FIG. 9 may be performed so that the charge storage pattern 200 and the tunnel insulation pattern 210 may be sequentially stacked on sidewalls of the first lower and upper blocking patterns 192 and 194 and a portion of the first impurity region 102, and the channel layer 230 may be formed on the tunnel insulation pattern 210, a portion of the first impurity region 102, and the uppermost one of the insulation layers 110 of the first upper mold.

Referring to FIGS. 17A and 17B, processes substantially the same as or similar to those illustrated with reference to FIGS. 10 to 14 and FIGS. 1 to 2A to 2B may be performed to complete the fabrication of the vertical memory device.

Figure 21:
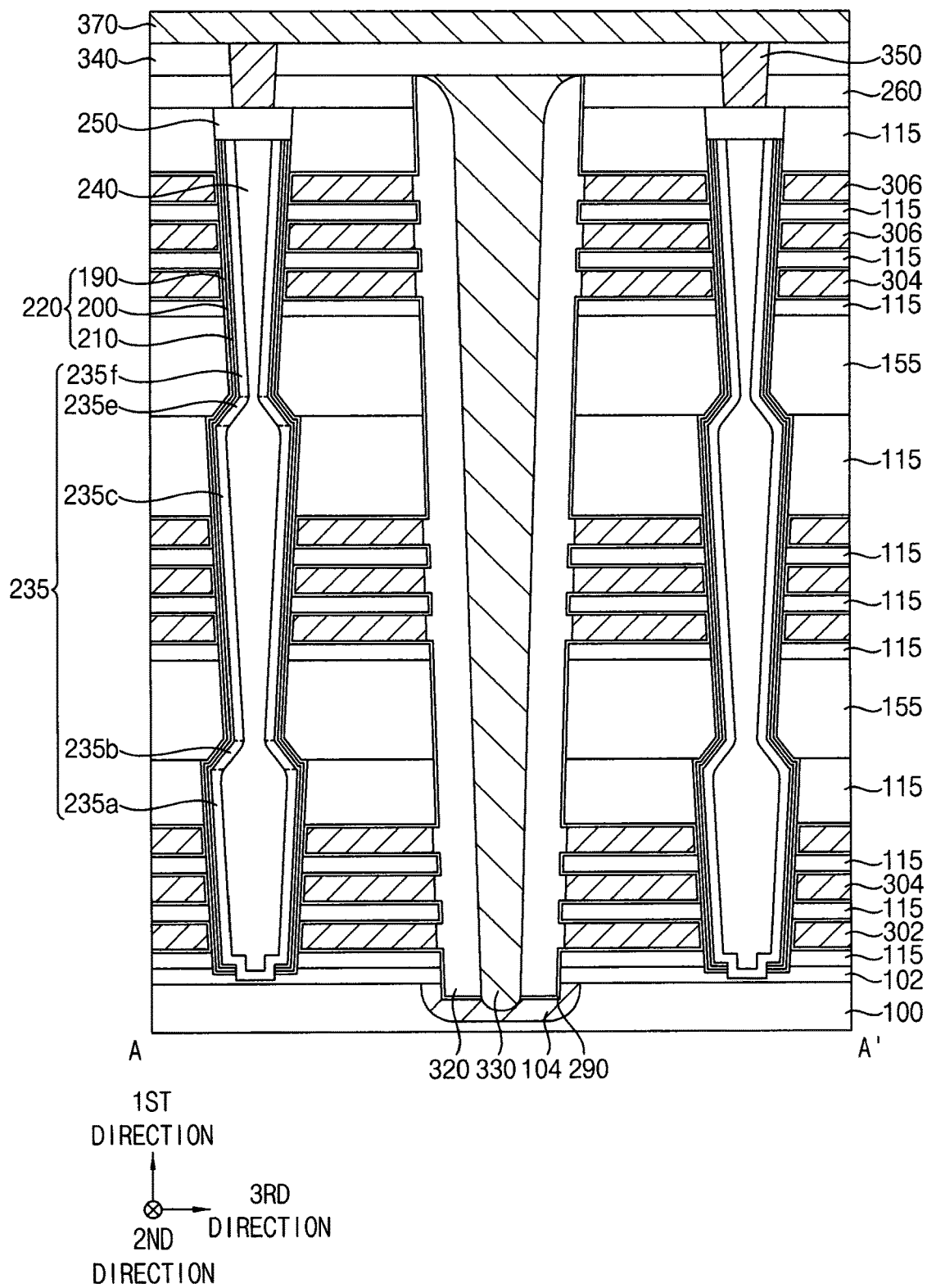
FIG. 21 is a cross-sectional view illustrating a vertical memory device in accordance with example embodiments.

FIG. 21 is a cross-sectional view illustrating a vertical memory device in accordance with example embodiments. The vertical memory device may be substantially the same as or similar to those illustrated with reference to FIGS. 1 and 2A to 2B, except for the shape of the channel, the charge storage structure, and the connecting pattern. Thus, like reference numerals refer to like elements, and detailed descriptions thereof are omitted herein.

Referring to FIG. 21, while the channel 235 of FIGS. 1 and 2A to 2B includes the first to third portions 235a, 235b and 235c sequentially stacked in the first direction, the channel 235 of FIG. 21 may further include fourth and fifth portions 235e and 235f sequentially stacked on the third portion 235c. The first, second, third, fourth, and fifth portions 235a, 235b, 235c, 235e, and 235f may be in material continuity with one another.

The fourth and fifth portions 235e and 235f of the channel 235 may have shapes similar to those of the second and third portions 235b and 235c, respectively. For example, the fourth portion 235e of the channel 235 may have a width gradually decreasing from a bottom toward a top thereof, and the fifth portion 235f of the channel 235 may have a width gradually increasing from a bottom toward a top thereof. Additionally, the fourth portion 235e and a lower portion of the fifth portion 235f of the channel 235 may be surrounded by the connecting pattern 155.

FIG. 21 shows that the channel 235 includes the first, third and fifth portions 235a, 235c and 235f each having a width gradually increasing from a bottom toward a top thereof and the second and fourth portions 235b and 235e having a width gradually decreasing from a bottom toward a top thereof, however, the inventive concepts may not be limited thereto. For example, the channel 235 may include a plurality of portions each having a width that gradually increases from a bottom toward a top thereof and a plurality of portions each having a width gradually decreasing from a bottom toward a top thereof.

Figure 22:
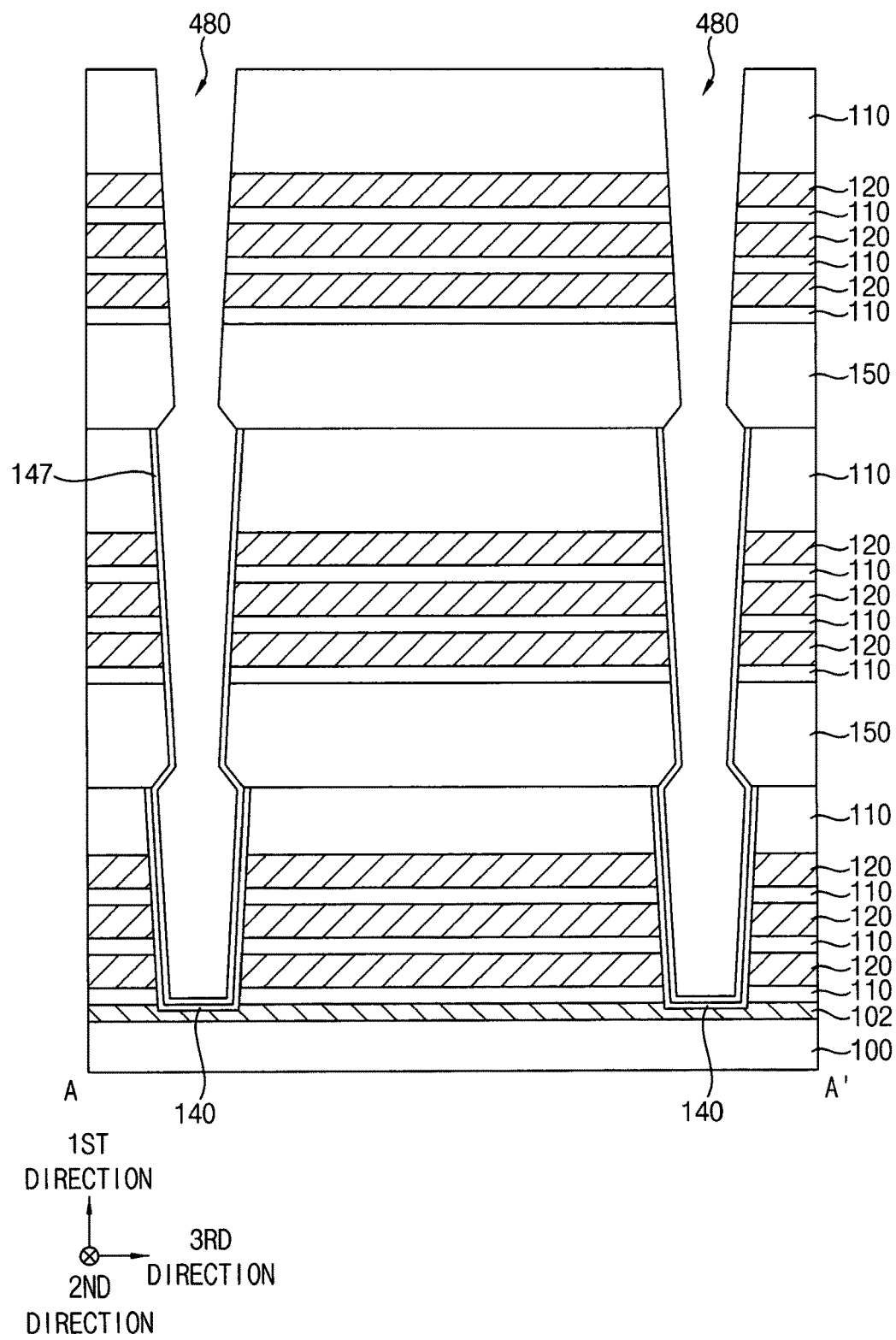
FIGS. 22 to 24 are cross-sectional views illustrating a method of manufacturing fa vertical memory device in accordance with example embodiments.
Figure 23:
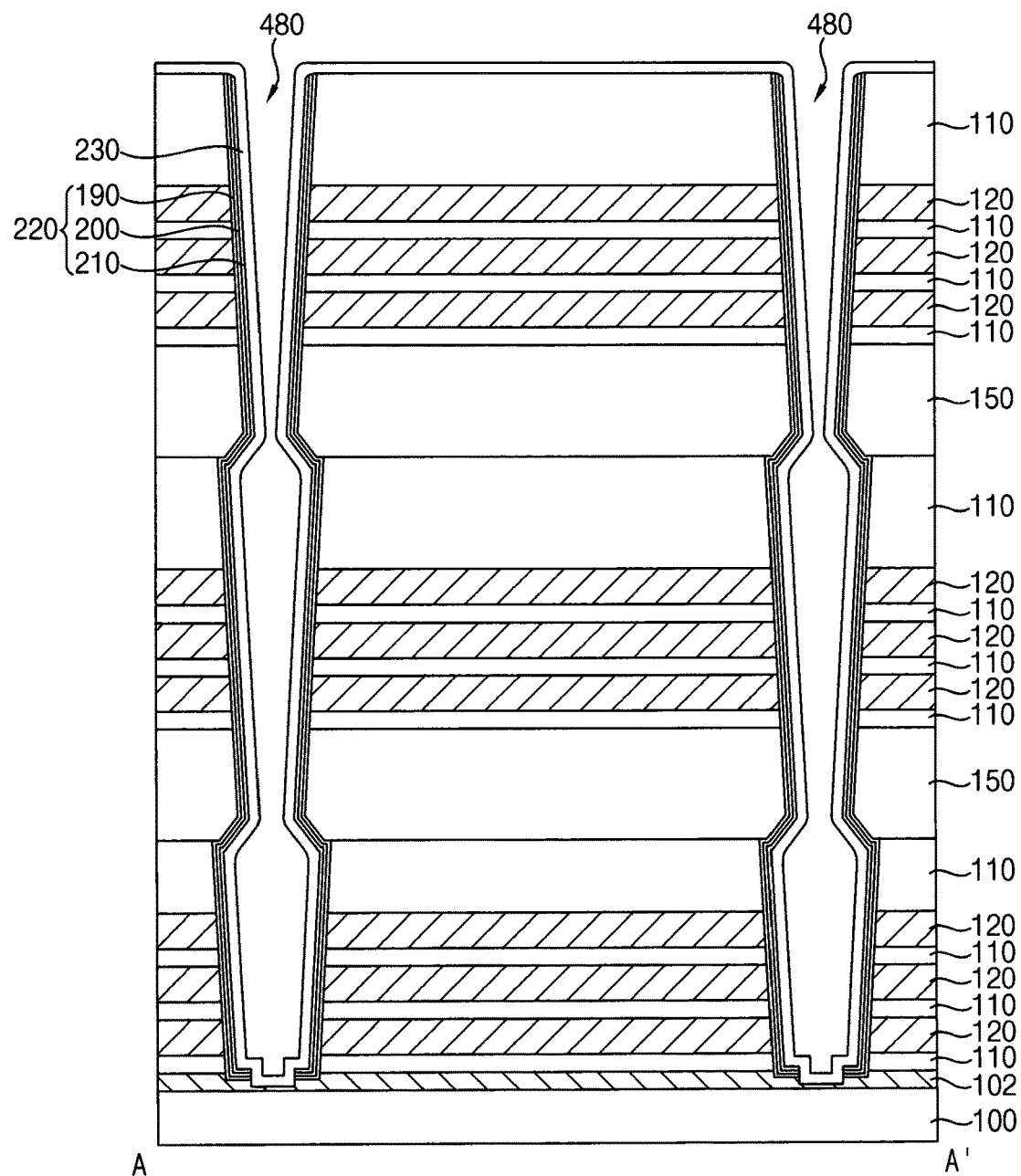

FIGS. 22 and 23 are cross-sectional views illustrating a method of manufacturing a vertical memory device in accordance with example embodiments. This method may include processes substantially the same as or similar to those illustrated with reference to FIGS. 3 to 14 and FIGS. 1 and 2A to 2B, and detailed descriptions thereof are omitted herein.

Referring to FIG. 22, processes substantially the same as or similar to those illustrated with reference to FIGS. 3 to 8 may be performed, and a third barrier pattern 147 may be formed on a sidewall and a bottom of the first gap 160 having the first barrier pattern 140 and a sidewall of the second channel hole 170.

The third barrier pattern 147 may include a material substantially the same as that of the first barrier pattern 140.

Processes substantially the same as or similar to those illustrated with reference to FIGS. 6 to 8 may be performed so that a second upper mold may be formed on the first upper mold and a fourth channel hole may be formed through the second upper mold to expose the second channel hole 170.

Hereinafter, the first gap 160, the second channel hole 170 and the fourth channel hole sequentially stacked in the first direction to be connected with each other may be referred to as a fifth channel hole.

Referring to FIG. 23, processes substantially the same as or similar to those illustrated with reference to FIG. 5 may be performed so that the first and third barrier patterns 140 and 147 may be removed and the charge storage structure 220 and the channel layer 230 may be formed.

Referring to FIG. 21 again, processes substantially the same as or similar to those illustrated with reference to FIGS. 10 to 14 and FIGS. 1 and 2A to 2B may be performed to complete the fabrication of the vertical memory device.

Figure 24:
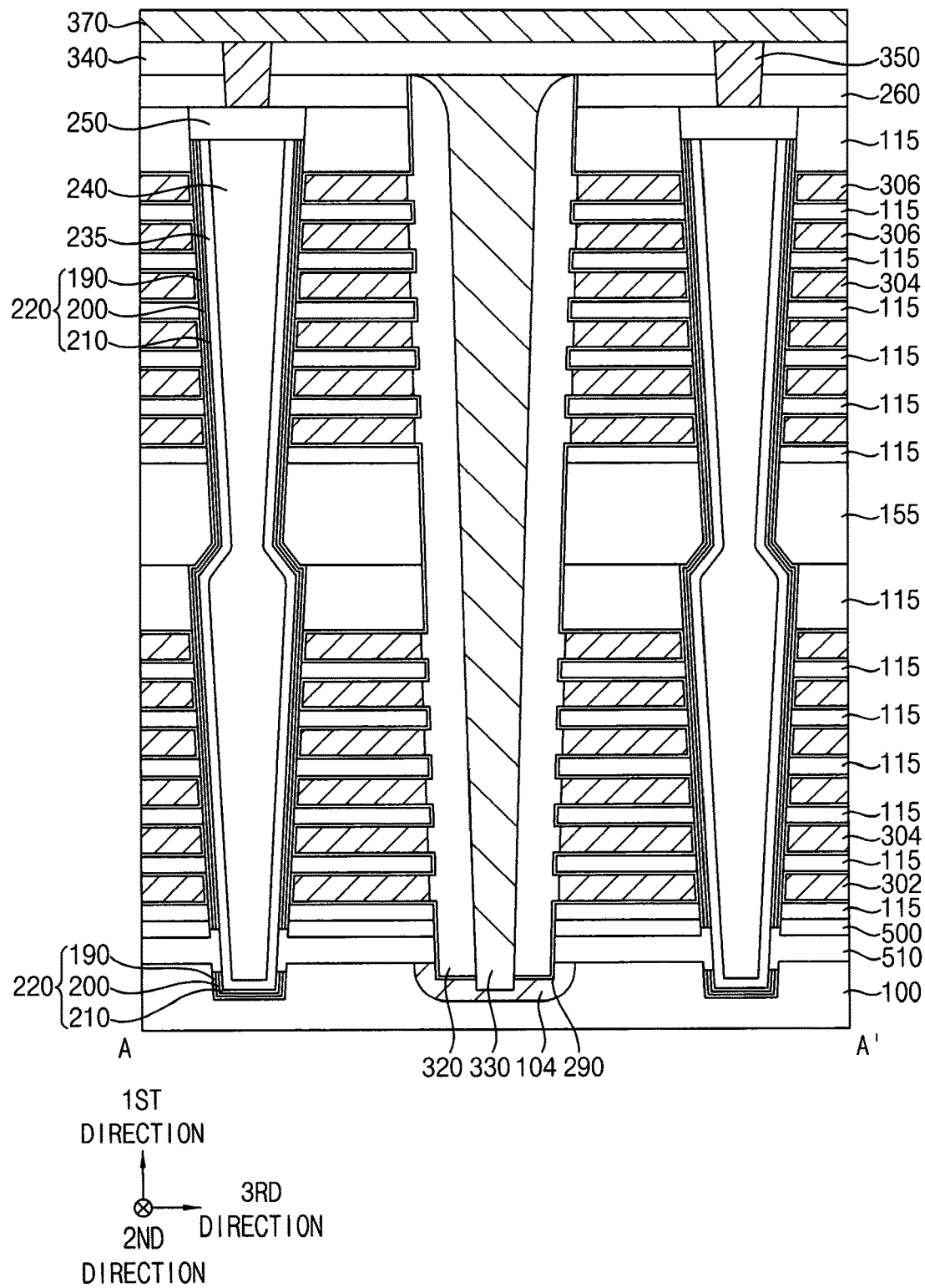

FIG. 24 is a cross-sectional view illustrating a vertical memory device in accordance with example embodiments. The vertical memory device may be substantially the same as or similar to those illustrated with reference to FIGS. 1 and 2A to 2B, except for elements. Thus, like reference numerals refer to like elements, and detailed descriptions thereof are omitted herein.

Referring to FIG. 24, a channel connecting pattern 510 and a support layer 500 may be sequentially stacked between the upper surface of the substrate 100 and a lowermost one of the insulation patterns 115 of the lower mold, and the first impurity region 102 may not be formed.

The channel connecting pattern 510 may directly contact lower outer sidewalls of the channels 235 so as to connect the channels 235 with each other. The charge storage structure 220 may not be formed on the lower outer sidewall of each of the channels 235, and the charge storage structure 220 may be divided into an upper portion covering most of an outer sidewall of the channel 235 and a lower portion covering a lower outer sidewall and a bottom of the channel 235 on the substrate 100.

The channel connecting pattern 510 may include, e.g., polysilicon doped with n-type impurities, and the support layer 500 may include undoped polysilicon or polysilicon doped with n-type impurities.

While example embodiments have been particularly shown and described, it will be understood by one of ordinary skill in the art that variations in form and detail may be made therein without departing from the spirit and scope of the claims.

What is claimed is:

1. A vertical memory device comprising:
   gate electrodes stacked on a substrate, the gate electrodes being spaced apart from each other in a vertical direction substantially perpendicular to an upper surface of the substrate, wherein the gate electrodes include:
   first gate electrodes;
   second gate electrodes on the first gate electrodes;
   an insulation pattern on an uppermost one of the first gate electrodes;
   a connecting pattern on the insulation pattern and under a lowermost one the second gate electrodes; and
   a channel extending through the gate electrodes, the channel including:
   a first portion;
   a second portion on and connected to the first portion, the second portion having a sidewall slanted with respect to the upper surface of the substrate so that the second portion has a width that gradually decreases from a bottom toward a top of the second portion; and
   a third portion on and connected to the second portion, wherein a lower portion of the third portion and the second portion of the channel are surrounded by the connecting pattern, and an upper portion of the first portion of the channel is surrounded by the insulation pattern.

2. The vertical memory device of claim 1, wherein the sidewall of the second portion of the channel has a constant slope with respect to the upper surface of the substrate.

3. The vertical memory device of claim 1, wherein the sidewall of the second portion of the channel has a varying slope with respect to the upper surface of the substrate.

4. The vertical memory device of claim 1, wherein each of the first and third portions of the channel has a sidewall slanted with respect to the upper surface of the substrate, and widths of the sidewalls of the first and third portions of the channel gradually increase from bottoms toward tops of the first and third portions, respectively.

5. The vertical memory device of claim 1, wherein the connecting pattern includes TEOS or HDP oxide.

6. The vertical memory device of claim 1, wherein a portion of a lower surface of the connecting pattern is lower than an upper surface of the insulation pattern.

7. The vertical memory device of claim 6, wherein the portion of the lower surface of the connecting pattern is adjacent to the lower portion of the third portion and the second portion of the channel.

8. The vertical memory device of claim 1, wherein the channel further includes:
   a fourth portion on and connected to the third portion, the fourth portion having a sidewall slanted with respect to the upper surface of the substrate so that the fourth portion has a width that gradually decreases from a bottom toward a top of the fourth portion; and
   a fifth portion on and connected to the fourth portion.

9. The vertical memory device of claim 8, wherein the fifth portion has a sidewall slanted with respect to the upper surface of the substrate so that the fifth portion has a width that gradually increases from a bottom toward a top of the fifth portion.

10. The vertical memory device of claim 1,
    wherein channel has a cup-like shape, and
    wherein the vertical memory device further comprises a charge storage structure covering an outer sidewall of the channel.

11. The vertical memory device of claim 10, wherein a portion of the charge storage structure protrudes upwardly and does not contact the outer sidewall of the channel.

12. A vertical memory device comprising:
    gate electrodes stacked on a substrate, the gate electrodes being spaced apart from each other in a vertical direction substantially perpendicular to an upper surface of the substrate, wherein the gate electrodes include:
    first gate electrodes;

second gate electrodes on the first gate electrodes;
an insulation pattern on an uppermost one of the first gate electrodes;
a connecting pattern on the insulation pattern and under a lowermost one the second gate electrodes; and
a channel extending through the gate electrodes, the channel including:
  a first portion having a width that gradually increases from a bottom toward a top of the first portion;
  a second portion on and connected to the first portion, the second portion having a width that gradually decreases from a bottom toward a top of the second portion; and
  a third portion on and connected to the second portion, the third portion having a width that gradually increases from a bottom toward a top of the third portion,
wherein a lower portion of the third portion and the second portion of the channel are surrounded by the connecting pattern, and an upper portion of the first portion of the channel is surrounded by the insulation pattern.

13. The vertical memory device of claim 12, wherein the connecting pattern includes TEOS or HDP oxide.

14. The vertical memory device of claim 12, wherein the channel further includes:
  a fourth portion on and connected to the third portion, the fourth portion having a width that gradually decreases from a bottom toward a top of the fourth portion; and
  a fifth portion on and connected to the fourth portion, the fifth portion having a width that gradually increases from a bottom toward a top of the fifth portion.

15. A vertical memory device comprising:
gate electrodes stacked on a substrate, the gate electrodes being spaced apart from each other in a vertical direction substantially perpendicular to an upper surface of the substrate; and
a channel extending through the gate electrodes, the channel including:
  a first portion having a width that gradually increases from a bottom toward a top of the first portion;
  a protrusion protruding upwardly from an upper surface of the first portion; and
  a second portion on and connected to the first portion and overlapping the protrusion in the horizontal direction, the second portion having a width that gradually increases from a bottom toward a top of the second portion, wherein a width of a lower portion of the second portion is less than a width of an upper portion of the first portion.

16. The vertical memory device of claim 15, further comprising a charge storage structure covering an outer sidewall of the channel.

17. The vertical memory device of claim 16, wherein the charge storage structure includes a tunnel insulation pattern, a charge storage pattern, and a blocking pattern sequentially stacked from the outer sidewall of the channel in a horizontal direction substantially parallel to the upper surface of the substrate, and
wherein the blocking pattern includes:
  a lower portion covering the first portion and the protrusion of the channel; and
  an upper portion covering an outer sidewall of the second portion of the channel.

18. The vertical memory device of claim 17,
wherein each of the tunnel insulation pattern and the charge storage pattern is continuously formed on the outer sidewall of the channel, and
wherein the lower and upper portions of the blocking pattern are disconnected and spaced apart from each other.

19. The vertical memory device of claim 15, wherein the first portion, the protrusion portion, and the second portion are in material continuity with one another.

* * * * *